(12) United States Patent
Kim

(10) Patent No.: US 10,804,939 B2
(45) Date of Patent: Oct. 13, 2020

(54) MEMORY CONTROLLER AND OPERATING METHOD THEREOF

(71) Applicant: SK hynix Inc., Gyeonggi-do (KR)

(72) Inventor: Kyung Bum Kim, Gyeonggi-do (KR)

(73) Assignee: SK hynix Inc., Icheon-si (KR)

(*) Notice: Subject to any disclaimer, the term of this patent is extended or adjusted under 35 U.S.C. 154(b) by 49 days.

(21) Appl. No.: 16/233,461

(22) Filed: Dec. 27, 2018

(65) Prior Publication Data

US 2020/0014408 A1 Jan. 9, 2020

(30) Foreign Application Priority Data

Jul. 3, 2018 (KR) .................. 10-2018-0077313

(51) Int. Cl.
*H03M 13/29* (2006.01)
*G06F 11/10* (2006.01)
*G06F 9/30* (2018.01)

(52) U.S. Cl.
CPC ...... *H03M 13/2918* (2013.01); *G06F 9/3004* (2013.01); *G06F 11/1012* (2013.01); *H03M 13/2927* (2013.01)

(58) Field of Classification Search
CPC ............ G06F 9/3004; G06F 11/1012; H03M 13/2918; H03M 13/2927
See application file for complete search history.

(56) References Cited

U.S. PATENT DOCUMENTS

| | | | |
|---|---|---|---|
| 7,827,461 B1* | 11/2010 | Low | H03M 13/6591 714/752 |
| 8,219,878 B1 | 7/2012 | Varnica et al. | |
| 2017/0359090 A1* | 12/2017 | Shin | H03M 13/3927 |

FOREIGN PATENT DOCUMENTS

KR 10-0891782 B2 12/2003

* cited by examiner

*Primary Examiner* — Guy J Lamarre
(74) *Attorney, Agent, or Firm* — Perkins Coie LLP

(57) ABSTRACT

In a memory controller for performing error correction decoding, using an iterative decoding scheme, the memory controller includes a variable node update module for allocating the initial LLR values to variable nodes, and updating values of the variable nodes, using the initial LLR values and Check to Variable (C2V) messages corresponding to the variable nodes in an ith iteration, a syndrome checker for performing a syndrome check, using the values of the variable nodes updated in the ith iteration, and a reversal determiner for determining whether to reverse the sign of an initial LLR value of a target variable node based on a ratio of signs of C2V messages corresponding to the target variable node, when the syndrome check corresponding to the ith iteration fails.

18 Claims, 18 Drawing Sheets

$$H = \begin{bmatrix} 1 & 0 & 0 & 1 & \cdots & 0 \\ A_{1,1} & A_{1,2} & A_{1,3} & A_{1,4} & & A_{1,n} \\ 0 & 1 & 0 & 1 & \cdots & 1 \\ A_{2,1} & A_{2,2} & A_{2,3} & A_{2,4} & & A_{2,n} \\ \vdots & \vdots & \vdots & \vdots & & \vdots \\ 1 & 0 & 1 & 0 & \cdots & 1 \\ A_{n-k,1} & A_{n-k,2} & A_{n-k,3} & A_{n-k,4} & & A_{n-k,n} \end{bmatrix}$$

FIG. 4

$$\begin{bmatrix} 1 & 0 & 0 & 1 & \cdots & 0 \\ 0 & 1 & 0 & 1 & \cdots & 1 \\ \vdots & \vdots & \vdots & \vdots & & \vdots \\ 1 & 0 & 1 & 0 & \cdots & 1 \end{bmatrix} \times \begin{bmatrix} c_{i1} \\ c_{i2} \\ c_{i3} \\ \vdots \\ c_{in} \end{bmatrix} = \begin{bmatrix} S_{i1} \\ S_{i2} \\ \vdots \\ S_{in-k} \end{bmatrix}$$

$$H \qquad\qquad c_i^T \qquad\quad S_i$$

FIG. 6

| QUANTIZATION LEVEL | LLR1 | LLR2 | LLR3 | LLR4 | LLR5 | LLR6 | LLR7 | LLR8 |
|---|---|---|---|---|---|---|---|---|
| 2 | -4 | +4 | | | | | | |
| 3 | -4 | -2 | +4 | | | | | |
| 4 | -4 | -2 | +2 | +4 | | | | |
| 5 | -4 | -3 | -2 | +2 | +4 | | | |
| 6 | -4 | -3 | -2 | -1 | +2 | +4 | | |
| 7 | -4 | -3 | -2 | -1 | +1 | +2 | +4 | |
| 8 | -4 | -3 | -2 | -1 | +1 | +2 | +3 | +4 |

Bad information

MEMORY CONTROLLER AND OPERATING METHOD THEREOF

CROSS-REFERENCE TO RELATED APPLICATION

This patent document claims priority to and benefits of the Korean patent application number 10-2018-0077313 filed on Jul. 3, 2018, which is incorporated herein by reference in its entirety.

TECHNICAL FIELD

The technology and implementations disclosed in this patent document generally relate to a memory controller and an operating method thereof, and, more particularly, to error correction decoding in memory devices.

BACKGROUND

A memory system may include a storage media that stores data on memory devices therein either temporarily or persistently. In order to control errors in data that could have occurred as a result of interferences between adjacent memory cells or any data corruption occurring during writing, reading, transmission, or processing, the memory system may use error correction techniques such as error correction coding and decoding to ensure the reliability of data. The error correction techniques may be implemented in the form of hardware and/or software. For example, circuitry for error correction may perform error correction encoding and decoding in the memory system using an error correction code.

Low-density parity-check (LDPC) codes have performance exceeding other traditional error correction code techniques and have been widely used in communication and other systems. With its iterative decoding scheme, the LDPC coding may improve error correction performance as the code length increases without increasing computational complexity per bit. Still, the performance of LDPC codes can suffer in many circumstances where hard errors can cause inefficiencies in the number of computational cycles or iterations that are needed to produce a successful decoding, and even in some circumstances, fail to produce a proper decoding.

SUMMARY

The technology disclosed in this patent document can be implemented in embodiments to provide a memory controller, that among other features and benefits, is capable of preventing a decrease in performance of error correction decoding that could have occurred due to a hard error and to provide an operating method of the memory controller.

According to an aspect of the present disclosure, there is provided a memory controller for performing error correction decoding, using an iterative decoding scheme, the memory controller including a mapper configured to convert read values received from a channel to initial log likelihood ratio (LLR) values; a variable node update module configured to allocate the initial LLR values to a plurality of variable nodes, and update values of the variable nodes, using the initial LLR values and check to variable (C2V) messages corresponding to the variable nodes in an ith iteration, wherein i is a natural number that is less than a predetermined number of maximum iterations; a check node update module configured to generate C2V messages to be transferred to the variable nodes, using variable to check (V2C) messages corresponding to the check nodes in the ith iteration; a syndrome checker configured to perform a syndrome check, using the values of the variable nodes updated in the ith iteration; and a reversal determiner configured to, upon a determination by the syndrome checker that the syndrome check corresponding to the ith iteration has failed, determine whether to reverse the sign of an initial LLR value of a target variable node based on a ratio of signs of the C2V messages corresponding to the target variable node.

According to another aspect of the present disclosure, there is provided a method of performing, by a memory controller, error correction decoding, using an iterative decoding scheme, the method including converting read values received from a channel to initial LLR values; allocating the initial LLR values respectively to a plurality of variable nodes; generating C2V messages to be transferred to the variable nodes, using V2C messages input corresponding to the check nodes in an ith iteration; updating values of the variable nodes, using the initial LLR values and the C2V messages corresponding to the variable nodes in the ith (i is a natural number) iteration; performing a syndrome check, using the values of the variable nodes updated in the ith iteration; and determining whether to reverse the sign of an initial LLR value of a target variable node based on a ratio of signs of the C2V messages corresponding to the target variable node, when the syndrome check corresponding to the ith iteration fails.

According to still another aspect of the present disclosure, there is provided a memory apparatus that stores more than one bit of data per memory cell, the memory apparatus including a processor and a memory comprising processor executable code, wherein the processor executable code, upon execution by the processor causes the processor to configure a low-density parity check (LDPC) decoder to operate using a message-passing iterative decoding, the LDPC decoder including a plurality of variable nodes and a plurality of check nodes, the LDPC decoder configured to generate and pass messages between the variable nodes and the check nodes and to update the variable nodes and check nodes to enable multiple iterations of decoding operations to generate a decoded bit from a target variable node. Wherein the processor executable code, upon execution by the processor causes the LDPC decoder to assign an initial value to the target variable node; upon receipt of the messages sent to the target variable node from neighboring check nodes, determine whether a target memory cell corresponding to the target variable node has a hard error; upon a determination that the target memory cell has the hard error, reverse a sign of the initial value of the target variable node; and use the sign-reversed initial value together with the messages sent to the target variable node from neighboring check nodes to produce new messages that are sent to the neighboring check nodes.

According to an aspect of the present disclosure, there is provided a memory controller for performing error correction decoding, using an iterative decoding scheme, the memory controller including a mapper configured to translate read values received through a channel to initial Log Likelihood Ratio (LLR) values; a variable node update module configured to allocate the initial LLR values to a plurality of variable nodes, and update values of the variable nodes, using the initial LLR values and check to variable (C2V) messages input corresponding to the variable nodes in an ith (i is a natural number) iteration; a check node update module configured to generate C2V messages to be transferred to the variable nodes, using variable to check (V2C) messages input corresponding to the check nodes in the ith iteration; a syndrome checker configured to perform a syndrome check, using the values of the variable nodes updated in the ith iteration; and a reversal determiner configured to determine whether the sign of an initial LLR value of a target variable node is to be reversed, by considering a ratio of signs of C2V messages input corresponding to the target variable node among the variable nodes, when the syndrome check corresponding to the ith iteration fails.

According to another aspect of the present disclosure, there is provided a method of performing, by a memory controller, error correction decoding, using an iterative decoding scheme, the method including translating read values received through a channel to initial LLR values; allocating the initial LLR values respectively to a plurality of variable nodes; updating values of the variable nodes, using the initial LLR values and C2V messages input corresponding to the variable nodes in an ith (i is a natural number) iteration; generating C2V messages to be transferred to the variable nodes, using V2C messages input corresponding to the check nodes in the ith iteration; performing a syndrome check, using the values of the variable nodes updated in the ith iteration; and determining whether the sign of an initial LLR value of a target variable node is to be reversed, by considering a ratio of signs of C2V messages input corresponding to the target variable node among the variable nodes, when the syndrome check corresponding to the ith iteration fails.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present.

FIG. 4 is a diagram illustrating an example of a syndrome vector calculated using the parity check matrix shown in FIG. 2.

FIG. 6 is a diagram illustrating an example of a lookup table.

DETAILED DESCRIPTION

Figure 1:
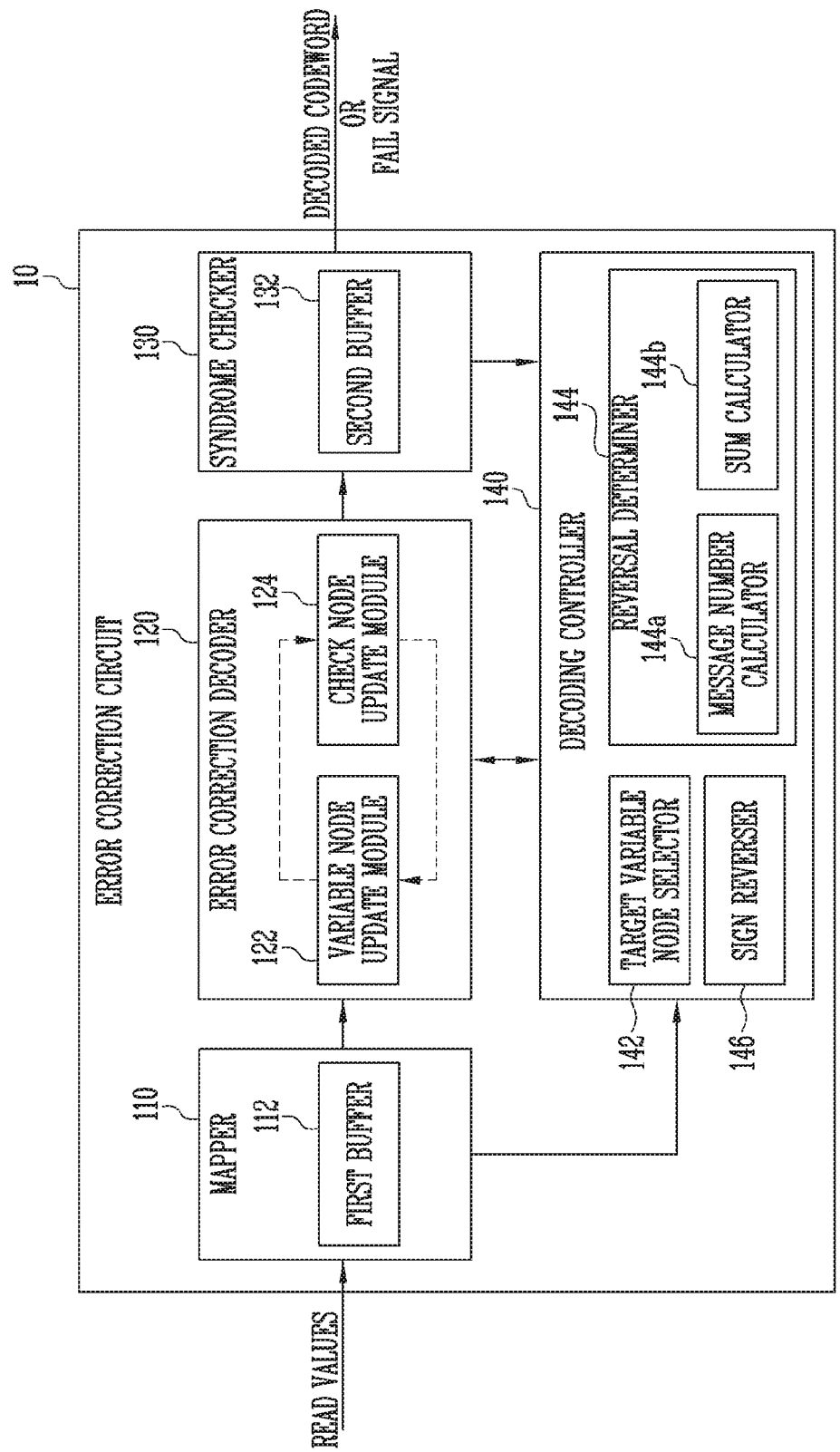
FIG. 1 is a diagram illustrating an example of an error correction circuit based on an embodiment of the disclosed technology.

FIG. 1 is a diagram illustrating an example of an error correction circuit based on an embodiment of the disclosed technology.

The error correction circuit 10 may perform error correction decoding, using various algorithms employing an iterative decoding scheme. For example, the error correction circuit 10 may perform error correction decoding, using a Message Passing Algorithm (MPA), which is also referred to as a Belief Propagation Algorithm (BPA).

In an implementation using iterative decoding algorithms, the error correction circuit 10 may perform error correction decoding within a maximum iteration number (maximum number of iterations) that is specified according to the iterative decoding scheme. When a valid codeword that satisfies constraints of a parity check matrix of an Error Correction Code (ECC) is generated within the maximum iteration number, the error correction circuit 10 may output the generated valid codeword as a decoded codeword. By contrast, the error correction circuit 10 may declare a decoding failure when it is unable to correctly decode. For example, when the valid codeword that satisfies the constraints of the parity check matrix of the ECC is not generated within the maximum iteration number, the error correction circuit 10 may output a "fail" signal indicating that the error correction decoding has failed. In an implementation, the error correction circuit 10 may use a low-density parity-check (LDPC) code as the ECC. In some implementations of the disclosed technology, the constraints of the parity check matrix may include a certain equation that must be satisfied to declare a decoding success.

The error correction circuit 10 may include a mapper 110, an error correction decoder 120, a syndrome checker 130, and a decoding controller 140.

The mapper 110 may receive read values from a channel. Read values are values that are read from a memory device; for example, a single read operation conducted over a memory cell may produce a binary value of either zero or one in a binary storage scheme. Here, the channel from which the read values are obtained may represent a wired or wireless medium over which information is conveyed or a storage medium in which information is stored. In some implementations of the disclosed technology, the channel may indicate an interface that carries data between the error correction circuit 10 and a memory device, or indicate the memory device itself. The read values may correspond to a codeword, the codeword being generated by adding parity bits to an original message during an error correction encoding. For example, the mapper 110 may receive, from a memory device, read values corresponding to one codeword. Each of the read values may be "0" or "1". When hard decision decoding is used, one set of read values may correspond to one codeword. One set of read values may be referred to as one read vector. When soft decision decoding is used, a plurality of sets of read values may correspond to one codeword. That is, when the soft decision decoding is used, a plurality of read vectors may correspond to one codeword.

The mapper 110 may generate quantized read values, using the read values. For example, the mapper 110 may generate a (g+1) level quantized read vector using g read vectors. Each read value included in the (g+1) level quantized read vector may be a (g+1) level quantized read value. The (g+1) level quantized read value may be a read pattern (e.g., a bit sequence) configured with g bits. For example, a 2-level quantized read value may be "1" or "0". Here, for example, one of the 2-level quantized read values may be "1", and the other of the 2-level quantized read values may be "0". As another example, a 3-level quantized read value may be "11", "10", "01" or "00". For example, one of the 3-level quantized read values may be "11", another of the 3-level quantized read values may be "00", and the rest of the 3-level quantized read values may be "10" or "01".

When the soft decision decoding is used (i.e., g is 2 or more), the mapper 110 may generate a (g+1) level quantized read vector by combining read vectors corresponding to g read voltages. For example, when two read voltages (e.g., a first read voltage and a second read voltage) are used, the mapper 110 may generate a 3-level quantized read vector by combining a read vector corresponding to the first read voltage and a read vector corresponding to the second read voltage. To this end, the mapper 110 may include a first buffer 112. When g read voltages are used, the first buffer 112 may receive and store read vectors respectively corresponding to the g read voltages. The mapper 110 may generate a (g+1) level quantized read vector by combining the read vectors stored in the first buffer 112, corresponding to the g read voltages.

When the hard decision decoding is used (e.g., g is 1), the mapper 110 may determine that one read vector itself is a 2-level quantized read vector.

The mapper 110 may convert the (g+1) level quantized read vector (the read vector quantized into g+1 levels) to an initial vector to be used in error correction decoding according to the iterative decoding scheme, and may provide the initial vector to the error correction decoder 120 and the decoding controller 140. The initial vector may include a plurality of initial values. That is, the mapper 110 may convert each of the (g+1) level quantized read values to an initial value. For example, the initial value may be a Log Likelihood Ratio (LLR) value.

As discussed above, the error correction decoder 120 may perform error correction decoding within the maximum iteration number, based on the initial vector received from the mapper 110. The error correction decoder 120 may perform error correction decoding, using various algorithms employing the iterative decoding scheme. For example, the error correction decoder 120 may perform error correction decoding, using the MPA. By the way of example and not by limitation, a sum-product algorithm or a min-sum algorithm may be used as the MPA.

In an example implementation of the MPA, messages in the form of probability vectors are passed among nodes in a graph where the iteration of the algorithm may be viewed as messages passing through the graph. The MPA may generate an output converging to a correct estimate of the read values through iterations of exchange of messages between variable nodes and check nodes. The message may include a variable to check (V2C) message transmitted from a variable node to a check node and a check to variable (C2V) message transmitted from a check node to a variable node. A combination of processes including a process of transmitting V2C messages from the variable nodes to the check nodes, a process of transmitting C2V messages from the check nodes to the variable nodes, and a process of updating values of the respective nodes through the respective processes may be referred to as one iteration.

The error correction decoder 120 may include a variable node update module 122 and a check node update module 124.

Before a first iteration is performed, the variable node update module 122 may initialize the variable nodes, using the initial vector (e.g., LLR values) received from the mapper 110. For example, the variable node update module 122 may allocate initial values included in the initial vector to the respective variable nodes. In the first iteration, the variable node update module 122 may generate and transmit V2C messages to the check node update module 124 such that the initial value of each of the variable nodes is transferred to a check node connected to the corresponding variable node. In each iteration, the variable node update module 122 may update values of the variable nodes, based on C2V messages received from the check node update module 124. In each of the iterations except the first iteration, the variable node update module 122 may generate V2C messages, based on the C2V messages received from the check node update module 124, and transmit the generated V2C messages to the check node update module 124.

In each iteration, the check node update module 124 may update values of the check nodes, based on the V2C messages received from the variable node update module 122. In each iteration, the check node update module 124 may generate C2V messages, based on the V2C messages received from the variable node update module 122, and transmit the generated C2V messages to the variable node update module 122.

The initial values and the messages may be referred to as soft information. The soft information may include values expressed by an integer or real number. In an example implementation, the soft information may be a Log Likelihood Ratio (LLR) value. The soft information may include estimates of probability or some equivalent information representing that an estimate of each symbol belonging to a codeword is "0" or "1" and a confidence value (probability or likelihood) of each estimate. For example, the soft information may include a sign bit and a magnitude bit. The sign bit may represent an estimate of the corresponding symbol. For example, a sign bit representing a negative value may indicate that it is more likely that the corresponding symbol will be "1", and a sign bit representing a positive value makes it less likely that the corresponding symbol is "1". On the contrary, the sign bit representing the positive value may indicate that it is more likely that the corresponding symbol will be "0", and the sign bit representing the negative value makes it less likely that the corresponding symbol is "0". The magnitude bit may represent a confidence value (probability or likelihood) with respect to the sign bit. For example, when the value of the magnitude bit increases, the confidence value (probability or likelihood) with respect to the sign bit may increase.

The error correction decoder 120 may perform the iterations within a maximum iteration number I and provide the syndrome checker 130 with values of variable nodes resulting from performing an ith iteration (hereinafter, referred to as a variable node vector $C_i$). Here, I is a natural number, and i is a natural number less than or equal to I. Although the variable node vector may be either a row vector or a column vector, it is assumed in the examples below that the variable node vector is a row vector.

When a valid codeword that satisfies constraints of a parity check matrix of an ECC is generated within the maximum iteration number I, the syndrome checker 130 may output the valid codeword as a decoded codeword.

For example, the syndrome checker 130 may store, in a second buffer 132, the variable node vector $C_i$ received from the error correction decoder 120 after the ith iteration, and perform a syndrome check on the received variable node vector $C_i$. In an example implementation, the syndrome check may be performed by checking whether all symbols of a syndrome vector $S_i$ are "0". The syndrome vector $S_i$ can be expressed as:

$$S_i = H \cdot C_i^T \text{(Equation 1)}$$

where $S_i$ is the syndrome vector corresponding to the ith iteration, H is the parity check matrix of the ECC, and $C_i^T$ is a transpose of a variable node vector $C_i$ corresponding to the ith iteration.

When all the symbols of the syndrome vector $S_i$ are "0", it is determined that the syndrome vector has passed the syndrome check. This means that the error correction decoding was successfully performed in the ith iteration. Therefore, the syndrome checker 130 may output the variable node vector stored in the second buffer 132 as a valid codeword, i.e., a decoded codeword.

On the other hand, when the syndrome vector $S_i$ has a nonzero symbol among the symbols of the syndrome vector $S_i$, it is determined that the syndrome check has failed. This means that the error correction decoding has failed in the ith iteration. Therefore, the error correction decoder 120 may perform an (i+1)th iteration as long as the maximum iteration number I has not been reached. A check node corresponding to the nonzero symbol among the symbols of the syndrome vector $S_i$ may be referred to as an Unsatisfied Check Node (UCN). When the syndrome check corresponding to the ith iteration fails, the syndrome checker 130 may notify the failure of the ith iteration to at least one of the error correction decoder 120 and the decoding controller 140.

When the valid codeword that satisfies the constraints of the parity check matrix of the ECC within the maximum iteration number I is not generated, the syndrome checker 130 may output a "fail" signal indicating that the error correction decoding has failed.

When the syndrome check corresponding to the ith iteration fails, the decoding controller 140 may adjust an initial value of a specific variable node among the variable nodes. Here, in some embodiments of the disclosed technology, adjusting the initial value may include reversing the sign of the initial value from a minus to a plus, or from a plus to a minus, while maintaining the magnitude of the initial value. The decoding controller 140 may control the error correction decoder 120 to perform a next iteration, using the adjusted initial value. The specific variable node of which initial value is to be adjusted may be referred to as a target variable node.

The decoding controller 140 may include a target variable node selector 142, a reversal determiner 144, and a sign reverser 146.

The target variable node selector 142 may receive an initial vector allocated to the variable nodes from the mapper 110. The target variable node selector 142 may determine at least one target variable node, based on the received initial vector. In an embodiment of the disclosed technology, the target variable node selector 142 may determine, as the target variable node, a variable node corresponding to an initial value having a set magnitude among initial values included in the initial vector. In one example, it is assumed that the initial vector is generated using 8-level quantized read values, and each of the initial values included in the initial vector has any one LLR value among a plurality of LLR values (e.g., −4, −3, −2, −1, +1, +2, +3, +4). In some implementations, the set magnitude may be set to have a magnitude of an initial value that is likely to be allocated to a memory cell in which a hard error has occurred. In some embodiments of the disclosed technology, the set magnitude may be the largest value among initial values to be allocated to the variable nodes. In an example implementation where LLR values can have one of 4, −3, −2, −1, +1, +2, +3, +4, the set magnitude may be "4". In this scenario, the target variable node selector 142 may determine a variable node corresponding to LLR values −4 and +4 as the target variable node. Then the target variable node selector 142 may provide, to the reversal determiner 144, information regarding the determined target variable node.

When the syndrome checker 130 notifies the reversal determiner 144 that the syndrome check corresponding to the ith iteration has failed, the reversal determiner 144 may determine whether the initial value of the target variable node is to be adjusted. For example, when the syndrome check corresponding to the ith iteration fails, the reversal determiner 144 may determine whether to reverse the sign of the initial value of the target variable node, for example, from +4 to −4.

When the syndrome checker 130 notifies the reversal determiner 144 that the syndrome check corresponding to the ith iteration has failed, the reversal determiner 144 may request that the error correction decoder 120 transmit C2V messages that had been input in the ith iteration, corresponding to the target variable node, and may receive the C2V messages corresponding to the target variable node from the error correction decoder 120.

In some embodiments, the reversal determiner 144 may determine whether to reverse the sign of the initial value of the target variable node based on a ratio of signs of the C2V messages corresponding to the target variable node. For example, where the sign of the initial value of the target variable node is a sign of a first type (e.g., a negative sign), when a number of C2V messages having the sign of the first type, among the C2V messages corresponding to the target variable node, is smaller than a number of C2V messages having a sign of a second type (e.g., a positive sign), the reversal determiner 144 may determine to reverse the sign of the initial value of the target variable node from the first type to the second type. That is, when the ratio of signs of the C2V messages corresponding to the target variable node indicates that more than half of the signs of the C2V messages are different from the sign of the initial value of the target variable node, the reversal determiner 144 may determine to reverse the sign of the initial value of the target variable node, To this end, the reversal determiner 144 may include a message number calculator 144a. The message number calculator 144a may calculate the number of C2V messages with the same sign as the sign of the initial value of the target variable node and the number of C2V messages with a different sign (i.e., different from the sign of the initial value of the target variable node), among the C2V messages corresponding to the target variable node.

When the number of C2V messages with the same sign as the sign of the initial value of the target variable node is equal to the number of C2V messages with the different sign, the reversal determiner 144 may determine whether to reverse the sign of the initial value of the target variable node based on magnitudes of the C2V messages corresponding to the target variable node. For example, where the sign of the initial value of the target variable node is a sign of a first type (e.g., a negative sign) and the number of C2V messages having the sign of the first type, among the C2V messages corresponding to the target variable node, is equal to the number of C2V messages having a sign of a second type (e.g., a positive sign), when a sum of magnitudes of C2V messages having the sign of the first type is smaller than a sum of magnitudes of C2V messages having the sign of the second type, the reversal determiner 144 may determine to reverse the sign of the initial value of the target variable node. To this end, the reversal determiner 144 may include a sum calculator 144b. The sum calculator 144b may calculate a sum of magnitudes of C2V messages with the same sign as the sign of the initial value of the target variable node and a sum of magnitudes of C2V messages with different sign (different from the sign of the initial value of the target variable node), among the C2V messages corresponding to the target variable node.

When it is determined that the sign of the initial value of the target variable node is to be reversed, the reversal determiner 144 may provide a notification to the sign reverser 146. Accordingly, the sign reverser 146 may reverse the sign of the initial value of the target variable node.

Accordingly, in a next iteration, the variable node update module 122 may generate and output V2C messages to be transferred to check nodes connected to the target variable node, using the initial value with reversed sign. As discussed above, the mapper 110, the syndrome checker 130, and the decoding controller 140 may be implemented in the outside of the error correction decoder 120. In some other embodiments of the disclosed technology, however at least one of the mapper 110, the syndrome checker 130, and the decoding controller 140 may be implemented in the error correction decoder 120.

Figures 2, 3:
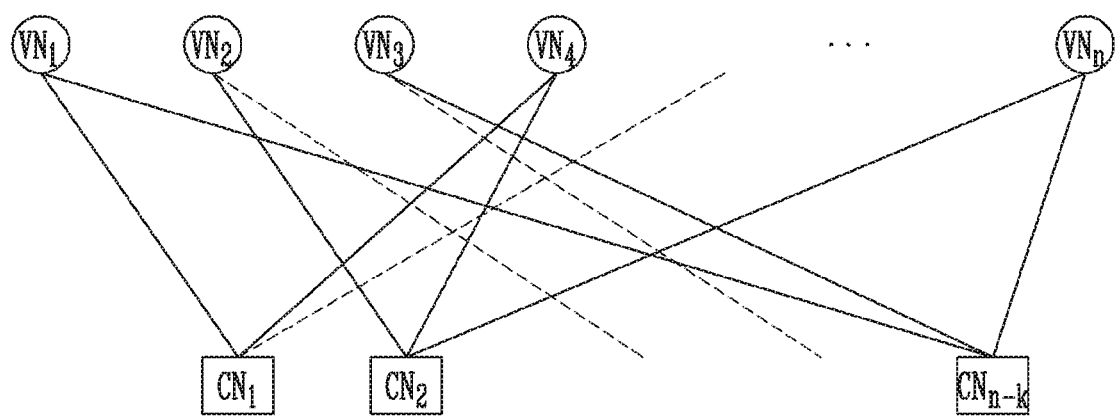
FIG. 2 illustrates an example of a parity check matrix.
FIG. 3 is a diagram illustrating an example of the parity check matrix shown in FIG. 2, using a Tanner graph.

FIG. 2 illustrates an example of a parity check matrix H corresponding to an (n, k) code. The (n, k) code may be defined as a parity check matrix having a size of (n−k)×n. For convenience of description, reference numeral $A_{n-k,n}$ has been assigned to an entry of n−k rows and n columns. That is, the reference numeral $A_{n-k,n}$ indicates the entry of n−k rows and n columns. Each entry of the parity check matrix may be expressed as "0" or "1" When a number of is included in the parity check matrix is relatively very small compared to a number of Os included in the parity check matrix, the (n, k) code may be referred to as an (n, k) LDPC code. Here, n and k may be natural numbers.

A matrix in which each entry is configured with a sub-matrix may be referred to as a base matrix. Each entry of the base matrix may be a sub-matrix having a size of m×m. Here, m is an integer equal to or larger than 2. For example, in the base matrix, "0" may represent that a corresponding entry is a zero matrix, and "1" may represent that a corresponding entry is not the zero matrix. For example, when the base matrix is used in a Quasi Cyclic (QC)-LDPC code, "1" may represent that a corresponding entry is a circulant matrix. The circulant matrix may be a matrix obtained by cyclic-shifting an identity matrix by a predetermined shift value. Any one circulant matrix may have a shift value different from that of another circulant matrix.

FIG. 3 is a diagram illustrating an example of the parity check matrix shown in FIG. 2, using a Tanner graph.

The (n, k) code may be expressed using a Tanner graph, which is an equivalent bipartite graph and includes two types of nodes. The Tanner graph may be expressed using n−k check nodes, n variable nodes, and edges. The check nodes correspond to rows of the parity check matrix, and the variable nodes correspond to columns of the parity check matrix. Each edge connects one check node to one variable node, and represents an entry expressed as "1" in the parity check matrix.

As shown in FIG. 3, the parity check matrix defining the (n, k) code shown in FIG. 2 may be expressed using a Tanner graph including n−k check nodes CN1 to CNn−k and n variable nodes VN1 to VNn. In this Tanner graph, solid lines and dotted lines, which connect the check nodes CN1 to CNn−k and the variable nodes VN1 to VNn, represent edges.

Iterative decoding may be performed according to an iterative message passing algorithm (MPA) between the check nodes CN1 to CNn−k and the variable nodes VN1 to VNn on the Tanner graph shown in FIG. 3. That is, iterative decoding may be performed by transferring messages between the check nodes CN1 to CNn−k and the variable nodes VN1 to VNn for each iteration.

The variable nodes may perform error correction, using C2V messages received from check nodes connected thereto. The variable nodes may generate V2C messages to be transmitted to the check nodes connected thereto, and may transmit each of the generated V2C messages to a corresponding check node.

The check nodes may perform a parity check, using V2C messages received from variable nodes connected thereto. A sign bit included in the V2C message may be used in the parity check. The check nodes may generate C2V messages to be transmitted to the variable nodes connected thereto, and may transmit each of the generated C2V messages to a corresponding variable node, FIG. 4 is a diagram illustrating an example of a syndrome vector calculated using the parity check matrix shown in FIG. 2.

As described above, a syndrome vector $S_i$ may be generated based on the parity check matrix H and the transpose $C_i^T$ corresponding to the ith iteration. Symbols $C_{i1}$, $C_{i2}$, $C_{i3}$, ..., $C_{i7}$ of the variable node vector $C_i$ represent values of variable nodes corresponding to the ith iteration. Symbols $S_{i1}$, $S_{i2}$, ..., and $S_{in-k}$ of the syndrome vector $S_i$ correspond to the check nodes $CN_1$ to $CN_{n-k}$ on the Tanner graph shown in FIG. 3, respectively.

When all the symbols $S_{i1}$, $S_{i2}$, ..., and $S_{in-k}$ of the syndrome vector $S_i$ are zero ("0"), it is determined that the syndrome vector $S_i$ has passed the syndrome check. This means that error correction decoding in a corresponding iteration has succeeded. Therefore, iterative decoding on a corresponding codeword may be ended, and the variable node vector $C_i$ corresponding to the ith iteration may be output as a decoded codeword.

When at least one symbol among all the symbols $S_{i1}$, $S_{i2}$, ..., and $S_{in-k}$ of the syndrome vector $S_i$ is nonzero, it is determined that the syndrome check has failed. This means that error correction decoding in a corresponding iteration has not succeeded. Therefore, a next iteration may be performed when the iteration decoding does not reach the maximum iteration number. Here, a check node corresponding to the nonzero symbol may be called an Unsatisfied Check Node or a UCN.

Figure 5:
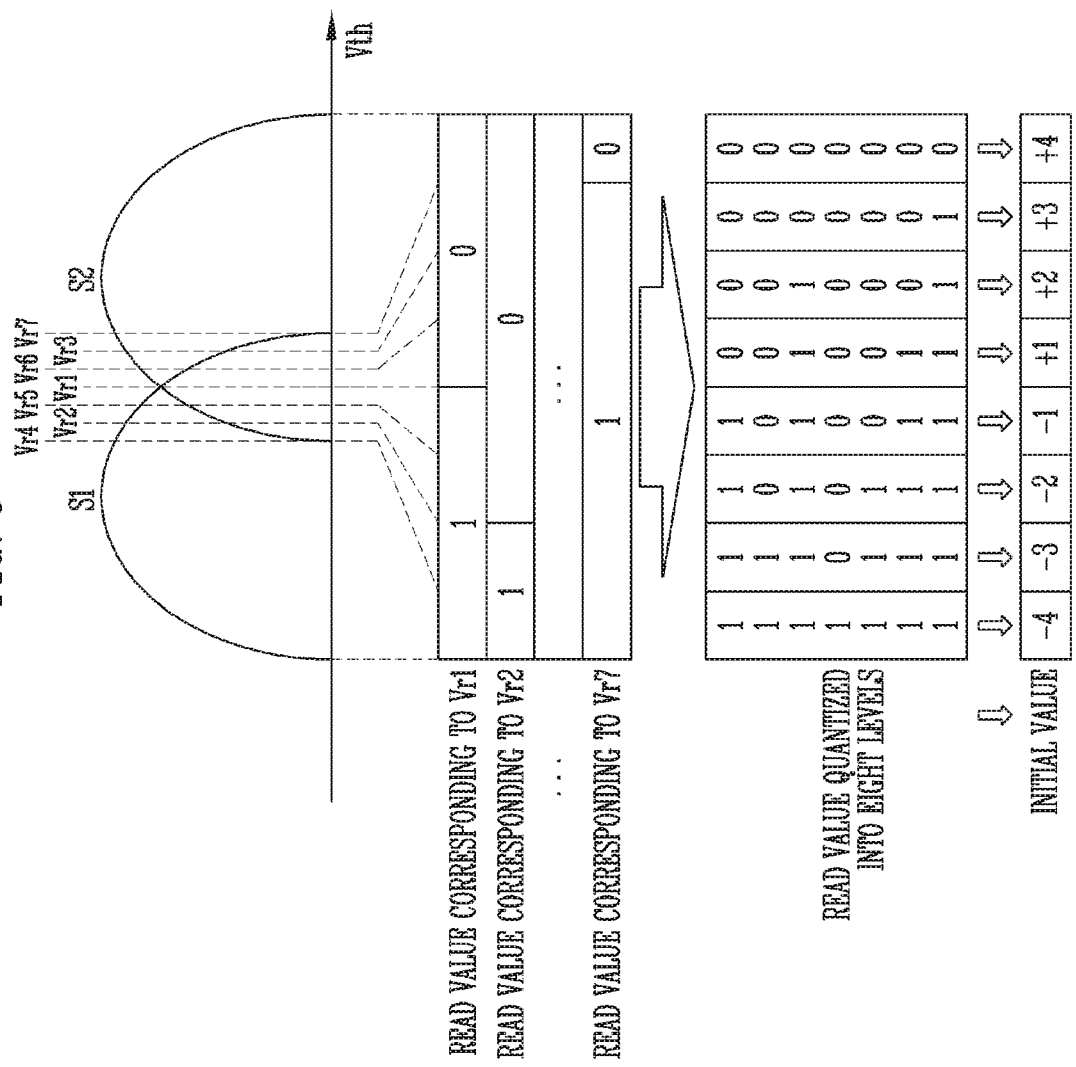
FIG. 5 is a diagram illustrating an example of a process of generating an initial value, using g read values in soft decision decoding.

FIG. 5 is a diagram illustrating an example of a process of generating an initial value, using g read values in soft decision decoding.

In FIG. 5, threshold voltage Vth distributions of memory cells each having a first state S1 and a second state S2 are illustrated. For n-bit multi-level cell NAND flash memory, the threshold voltage of each cell can be programmed to $2^n$ possible values. In an ideal multi-level cell NAND flash memory, each value corresponds to a non-overlapping threshold voltage window (not shown in FIG. 5). In FIG. 5, the vertical axis indicates the number of memory cells that has a particular threshold voltage represented on the horizontal axis. Memory cells programmed to the same value have their threshold voltages fall into the same window, but their exact threshold voltages could be different. As program/erase cycles increase, the margin between neighboring threshold voltage distributions of different programmed states decreases and eventually the distributions start overlapping. As a result, the memory cells with threshold voltages that fall within the overlapping range of the neighboring distributions may be read as being programmed to a value other than the original targeted value and thus cause read errors. Such read errors may be managed in most situations by using error correction codes (ECC).

In order to obtain g read vectors corresponding to one codeword when quantized level g+1 is used, each of g read voltages may be sequentially applied to a plurality of memory cells. For example, one read voltage may be applied when quantized level 2 is used, and two read voltages may be sequentially applied when quantized level 3 is used. Similarly, as shown in FIG. 5, seven read voltages Vr1, Vr2, Vr3, Vr4, Vr5, Vr6, and Vr7 may be sequentially applied to each memory cell when quantized level 8 is used. This means that, when the quantized level g+1 is used, g read voltages are applied to every memory cell, so that g read values can be obtained for each memory cell.

When one of the g read voltages is applied to a plurality of memory cells, the read value of a memory cell having a threshold voltage lower than the applied read voltage may be represented as "1", and the read value of a memory cell having a threshold voltage higher than the applied read voltage may be represented as "0".

The error correction circuit may generate a read value quantized into g+1 levels by combining read values respectively corresponding to the g read voltages, as will be explained later in this document. For example, when seven read voltages Vr1, Vr2, Vr3, Vr4, Vr5, Vr6, and Vr7 are used as shown in FIG. 5, the error correction circuit may generate a read value quantized into eight levels by combining the read values respectively corresponding to the seven read voltages.

The error correction circuit may convert or map a read value quantized into the g+1 levels to an initial value (e.g., an LLR value). The conversion or mapping to the initial value may be performed with reference to a predetermined lookup table.

FIG. 6 is a diagram illustrating an example of a lookup table.

Referring to FIG. 6, the lookup table may define LLR values respectively corresponding to a plurality of quantization levels.

The error correction circuit may convert each of (g+1) level quantized read values, which are quantized into g+1 quantization levels, to any one of g+1 LLR values corresponding to quantization level g+1, with respect to the lookup table.

For example, when quantization level 2 is used, the error correction circuit may convert one of 2-level quantized read values to a value LLR1, and convert the other of the 2-level quantized read values to a value LLR2. For example, "1" of the 2-level quantized read values may be converted to "−4", which is the value LLR1, and "0" of the 2-level quantized read values may be converted to "+4", which is the value LLR2.

Figure 7:
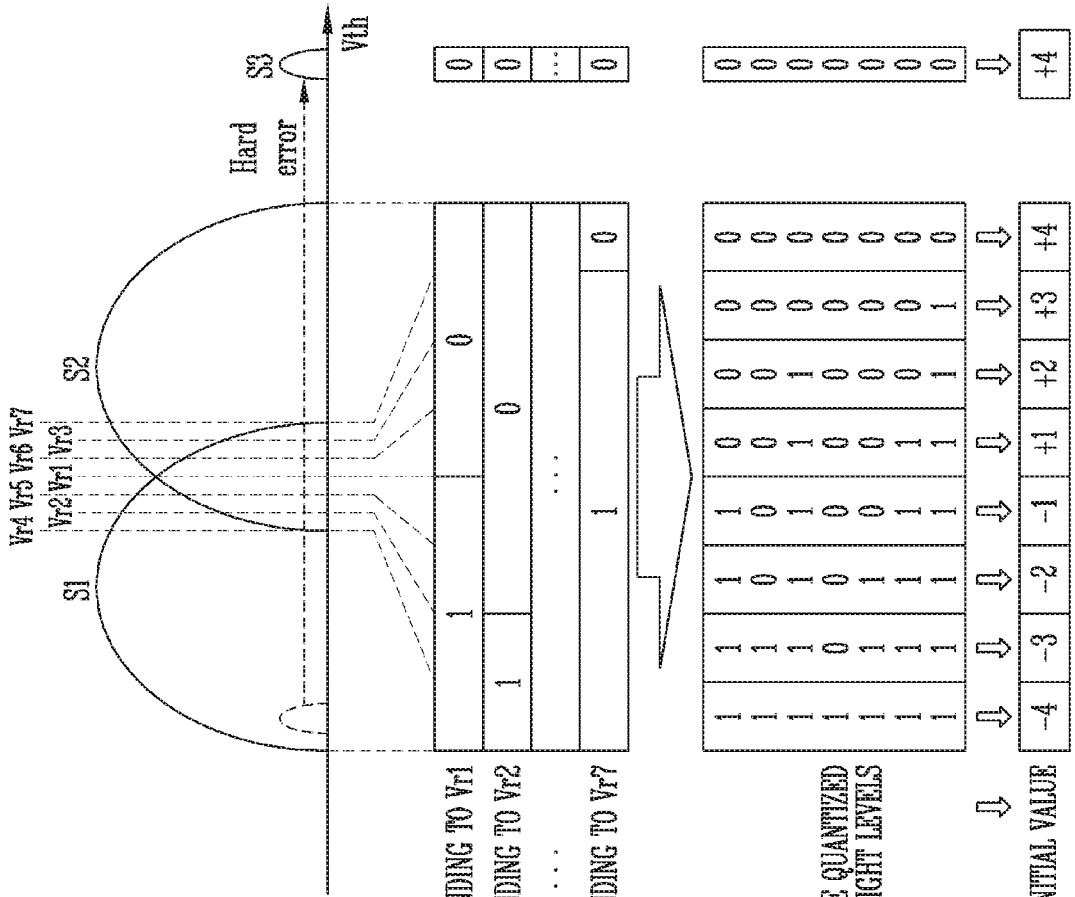
FIG. 7 is a diagram illustrating an example of an initial value allocation with respect to a memory cell in which a hard error occurs.

FIG. 7 is a diagram illustrating an example of an initial value allocation with respect to a memory cell in which a hard error has occurred.

As discussed above with reference to FIG. 5, the neighboring threshold voltage distributions may overlap, and the memory cells with threshold voltages that fall within the overlapping range of the neighboring distributions may be corrected in most situations by using the ECC. In some situations, however, In FIG. 7, a memory cell that was intended to be programmed into the first state S1 is programmed to a third state S3, which has a threshold voltage much higher than the second state S2 due to one or more error producing mechanisms that has caused the memory cell to be in a state S3, e.g., a hard error.

In this scenario, an initial value "+4" may be allocated to a variable node corresponding to the memory cell associated with the hard error, which was supposed to be programmed into the first state S1 but was erroneously programmed to the third state S3. That is, an initial value having a negative sign should have been allocated to the variable node corresponding to the memory cell associated with the hard error. Instead, the initial value having the positive sign was allocated to the variable node due to the hard error. Such an allocation of an erroneous initial value may have a negative impact on the performance of error correction decoding. For example, such an erroneous initial value allocation may hamper convergent to a valid codeword. Even if the value of the variable node to which an initial value is erroneously allocated may be corrected by an iterative decoding process, V2C messages generated in the corresponding variable node will provide bad information to a check node connected to the corresponding variable node, and C2V messages generated in the corresponding check node will provide bad information to other variable nodes connected to the corresponding check node.

The error correction decoding implemented based on an embodiment of the disclosed technology can correct such read values that are corrupted by hard errors by reversing the sign of a variable node corresponding to the erroneous memory cell, thereby improving the performance of the error correction decoding.

Figure 8:
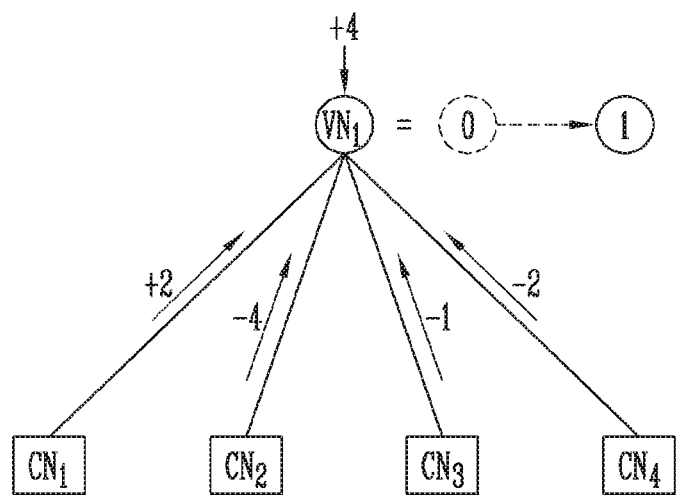
FIG. 8 is a diagram illustrating an example of a process of correcting a hard error.

FIG. 8 is a diagram illustrating an example of a process of correcting a hard error.

In FIG. 8, one target variable node $VN_1$, among a plurality of variable nodes, and four check nodes $CN_1$, $CN_2$, $CN_3$, and $CN_4$ connected to the target variable node $VN_1$ are illustrated for convenience of description. It is assumed that the target variable node $VN_1$ is a variable node corresponding to a memory cell in which a hard error has occurred.

In the embodiment described with reference to FIG. 8, it is to assumed that the initial value of the target variable node $VN_1$ is +4, If the positive sign represents a value of 0, the value of the target variable node $VN_1$ will be "0."

Subsequently, it is assumed that the values of C2V messages received from the check nodes $CN_1$, $CN_2$, $CN_3$, and $CN_4$ in an ith iteration are +2, −4, −1, and −2, respectively. The node update can be simplified using a min-sum algorithm. Thus, in the scenario shown in FIG. 8, an a posteriori probability (APP) of the target variable node $VN_1$ may be determined by summing the initial value of the target variable node $VN_1$ and the values of C2V messages received corresponding to the target variable node $VN_1$, and the value of the target variable node $VN_1$ may be determined according to a sign of the APP of the target variable node $VN_1$. For example, the APP of the target variable node $VN_1$ is obtained as follows: (+4)+(+2)+(−4)+(−1)+(−2)=−1 where the initial value of the target variable node $VN_1$ is +4, and the values of C2V messages received from the check nodes $CN_1$, $CN_2$, $CN_3$, and $CN_4$ are +2, −4, −1, and −2, respectively. In an implementation where the negative sign of the APP represents a value of 1, the value of the target variable node $VN_1$ may be updated to "1."

The value of the target variable node $VN_1$ may be corrected based on the initial value of the target variable node $VN_1$ and the C2V messages received from the check nodes $CN_1$, $CN_2$, $CN_3$, and $CN_4$. However, a certain wrong initial value (e.g., a value having equal magnitude but opposite in sign) of the target variable node $VN_1$ is not corrected but affects the error correction performance for other variable nodes. Moreover, even if the value (e.g., a value having equal magnitude but opposite in sign) of the target variable node $VN_1$ is corrected, the wrong initial value of the target variable node $VN_1$ may affect the error correction performance for variable node with correct initial value by providing check node, which is adjacent to the variable node with the correct initial value, with "bad" information. In other words, error correction may be performed on a bit corresponding to the memory cell in which the hard error has occurred based on the C2V messages received from the check nodes $CN_1$, $CN_2$, $CN_3$, and $CN_4$, but an update of the check node, which is adjacent to the variable node with the correct initial value, derived from the wrong initial value may affect the error correction performance for the variable node with the correct initial value.

Figure 9:
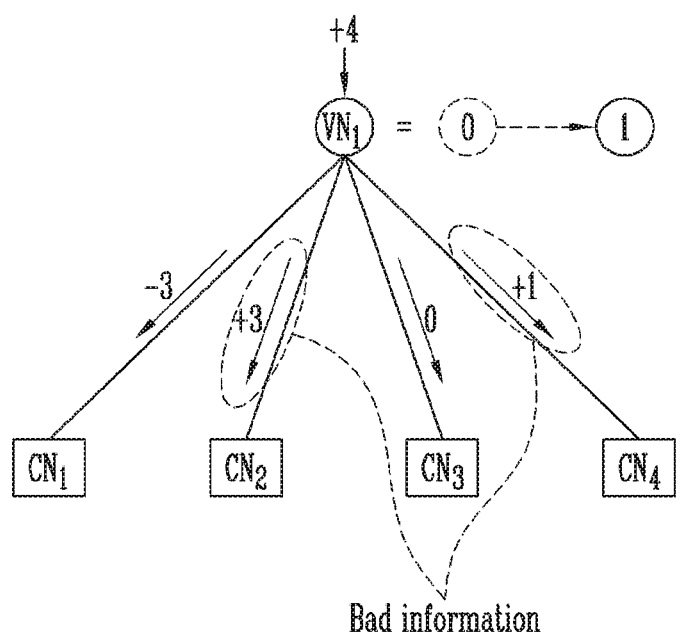
FIG. 9 illustrates how bad information is provided to check nodes from a variable node with hard error.

FIG. 9 illustrates how bad information is provided to check nodes from a variable node with hard error.

In FIG. 9, V2C messages are transmitted from the target variable node $VN_1$ to the check nodes $CN_1$, $CN_2$, $CN_3$, and $CN_4$ in an (i+1)th iteration after the hard error is corrected as described with reference to FIG. 8.

When the mini-sum algorithm is used, the value of a V2C message to be transmitted to a certain check node among the plurality of check nodes may be determined by summing values of C2V messages received from the other check nodes and the initial value of the target variable node $VN_1$. For example, the value of a V2C message to be transmitted to from the target variable node $VN_1$ to the check node $CN_1$ in the (i+1)th iteration may be determined as a value of "−3" obtained by summing the values of the C2V messages received from the check nodes $CN_2$, $CN_3$, and $CN_4$ in the ith iteration and the initial value of the target variable node $VN_1$. For example, the value of a V2C message to be transmitted from the target variable node $VN_1$ to the check node $CN_1$ is obtained as follows: (+4)+(−4)+(−1)+(−2)=−3. Similarly, values of V2C messages to be transmitted to the other check nodes $CN_2$, $CN_3$, and $CN_4$ may be calculated in this way.

Referring to FIG. 9, it can be seen that, although the value of the target variable node $VN_1$ is corrected to "1," the V2C messages transmitted from the target variable node $VN_1$ to the check nodes $CN_2$ and $CN_4$ have the positive sign instead of the negative sign. Although the hard error is corrected, the target variable node $VN_1$ provides bad information to the check nodes $CN_2$ and $CN_4$.

Figure 10:
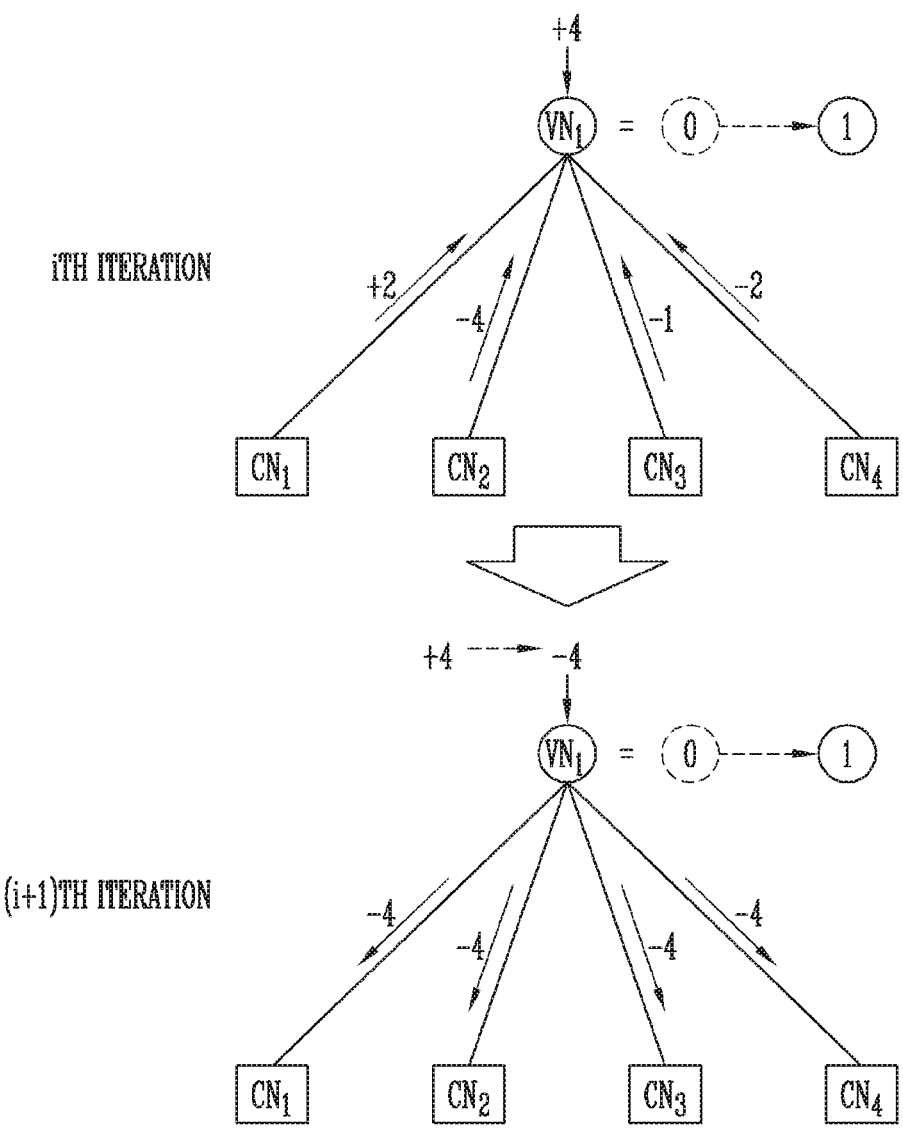
FIG. 10 is a diagram illustrating an example of a process of generating a V2C message by reversing the sign of an initial vale of a target variable node.

FIG. 10 is a diagram illustrating an example of a process of generating a V2C message by reversing the sign of an initial value of a target variable node.

Like the embodiment described with reference to FIG. 8, in the scenario described with reference to FIG. 10, it is assumed that the initial value of the target variable node $VN_1$ is +4, and values of the C2V messages transmitted from the check nodes $CN_1$, $CN_2$, $CN_3$, and $CN_4$ to the target variable node $VN_1$ in the ith iteration are +2, −4, −1, and −2, respectively.

In an embodiment of the disclosed technology, the error correction circuit may reverse the sign of the initial value of the target variable node $VN_1$, and may decide whether to reverse the sign of the initial value of the target variable node $VN_1$ based on a ratio of signs of C2V messages input to the target variable node $VN_1$. For example, as shown in FIG. 10, it is assumed that the initial value of the target variable node $VN_1$ has the positive sign. When, among the total C2V messages sent to update the target variable node $VN_1$, a number of C2V messages having the negative sign is larger than that of C2V messages having the positive sign, the error correction circuit may change the sign of the initial value of the target variable node $VN_1$ to the negative sign. Referring to FIG. 10, three C2V messages have the negative sign, and one C2V message has the positive sign. Therefore, the error correction circuit implemented based on an embodiment of the disclosed technology reverses the sign of the initial value of the target variable node $VN_1$ to the negative sign.

After the sign of the initial value of the target variable node $VN_1$ is reversed, V2C messages may be calculated using the sign-reversed initial value in the (i+1)th iteration. For example, the V2C message to be transmitted to the check node $CN_1$ in the (i+1)th iteration may be calculated according to a value obtained by summing the sign-reversed initial value and the values of the C2V messages received from the check nodes $CN_2$, $CN_3$, and $CN_4$ in the ith iteration. When the maximum magnitude of an initial value to be allocated to variable nodes is "4," the magnitude of a V2C message to be transmitted to the check node $CN_1$ may not exceed "4." For example, even if the value of the V2C message to be transmitted from the target variable node $VN_1$ to the check node $CN_1$ is "−11" where (−4)+(−4)+(−1)+(−2)=−11, the V2C message to be transmitted to the check node $CN_1$ may be tuned to −4 due to the magnitude limitation. This may be applied in calculation of all V2C messages and all C2V messages.

As can be seen in FIG. 10, when the value of the target variable node $VN_1$ is corrected to "1," all V2C messages transmitted to the check nodes $CN_1$, $CN_2$, $CN_3$, and $CN_4$ connected to the target variable node $VN_1$ have the negative sign. The target variable node $VN_1$ not only corrects its hard error but also provides correct information to all the check nodes $CN_1$, $CN_2$, $CN_3$, and $CN_4$.

Figure 11:
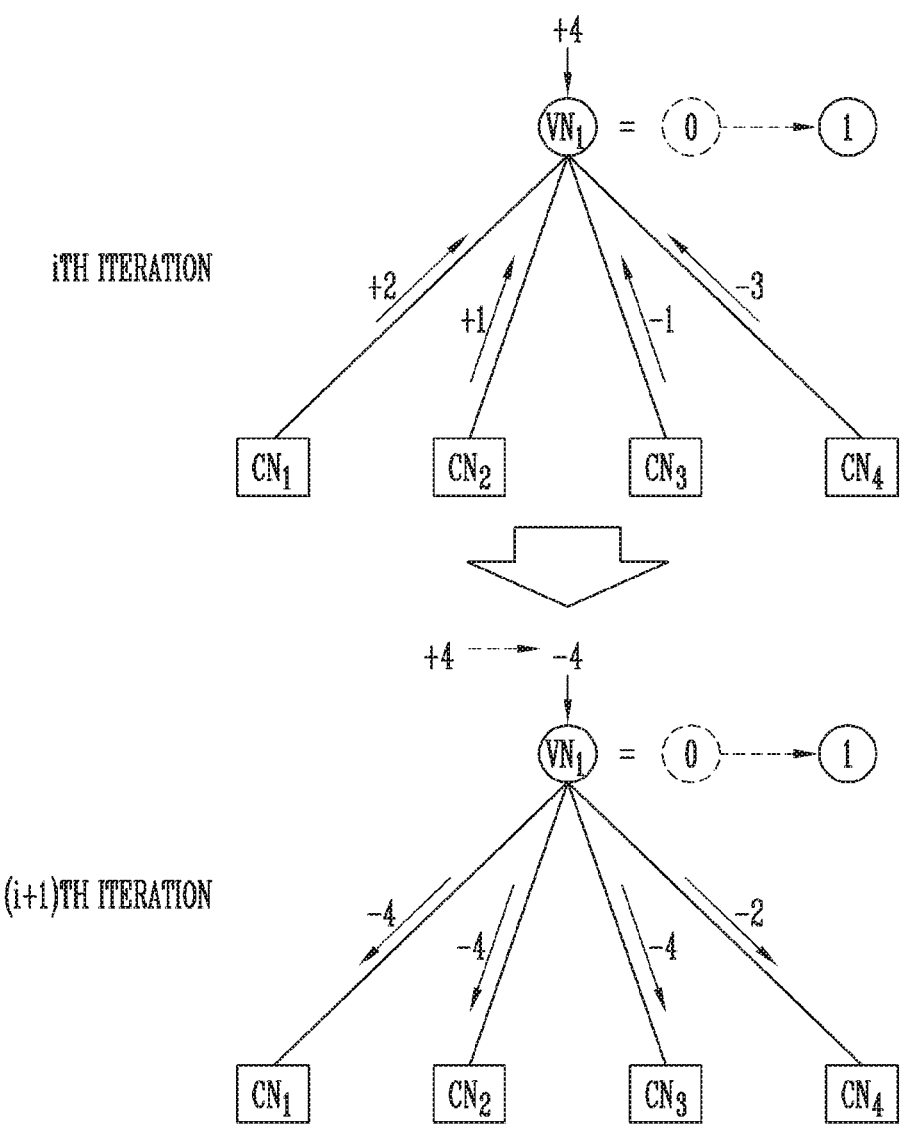
FIG. 11 is a diagram illustrating an example of a process of generating a V2C message by reversing the sign of an initial vale of a target variable node.

FIG. 11 is a diagram illustrating an example of a process of generating a V2C message by reversing the sign of an initial vale of a target variable node.

In this scenario, it is assumed that the initial value of the target variable node $VN_1$ is +4, and the values of the C2V message transmitted from the check nodes $CN_1$, $CN_2$, $CN_3$, and $CN_4$ to the target variable node $VN_1$ in the ith iteration are +2, +1, −1, and −3, respectively.

As described above, the error correction circuit implemented based on an embodiment of the disclosed technology may reverse the sign of the initial value of the target variable node $VN_1$, and may decide whether to reverse the sign of the initial value of the target variable node $VN_1$ based on a ratio of signs of C2V messages sent to the target variable node $VN_1$. When a number of C2V messages having the positive sign among the C2V messages sent to the target variable node $VN_1$ is equal to that of C2V messages having the negative sign among the C2V messages sent to the target variable node $VN_1$, the correction circuit may decide whether to reverse the sign of the initial value of the target variable node $VN_1$ based on the sum of magnitudes of the C2V messages. For example, as shown in FIG. 11, it is assumed that the initial value of the target variable node $VN_1$ has the positive sign. When, among the total C2V messages sent to the target variable node $VN_1$, a sum of magnitudes of C2V messages having the negative sign is larger than that of magnitudes of C2V messages having the positive sign, the error correction circuit may change the sign of the initial value of the target variable node $VN_1$ to the negative sign. Referring to FIG. 11, the sum of the magnitudes of the C2V messages having the positive sign is "3" (2+1=3), and the sum of the magnitudes of the C2V messages having the negative sign is "4" (1+3=4). Therefore, the error correction circuit implemented based on an embodiment of the disclosed technology reverses the sign of the initial value of the target variable node $VN_1$ to the negative sign.

When the sign of the initial value of the target variable node VN1 is reversed, V2C messages may be calculated using the sign-reversed initial value in the (i+l)th iteration. For example, the V2C message to be transmitted to the check node CN1 in the (i+l)th iteration may be calculated by summing the sign-reversed initial value and values of C2V messages received from the check nodes CN2, CN3, and CN4 in the ith iteration. Like the scenario described with reference to FIG. 10, when the maximum magnitude of an initial value to be allocated to variable nodes is "4," the magnitude of a V2C message to be transmitted to the check node CN1 may not exceed "4." For example, even if the value of the V2C message to be transmitted from the target variable node VN1 to the check node CN1 is "−7" where (−4)+(−1)+(+1)+(−3)=−7, but the corresponding V2C message may be tuned to −4 due to magnitude limitation.

As can be seen in FIG. 11, when the value of the target variable node $VN_1$ is corrected to "1," all V2C messages transmitted to the check nodes $CN_1$, $CN_2$, $CN_3$, and $CN_4$ connected to the target variable node $VN_1$ have the negative sign. The target variable node $VN_1$ not only corrects its hard error but also provides correct information to all the check nodes $CN_1$, $CN_2$, $CN_3$, and $CN_4$.

Figure 12:
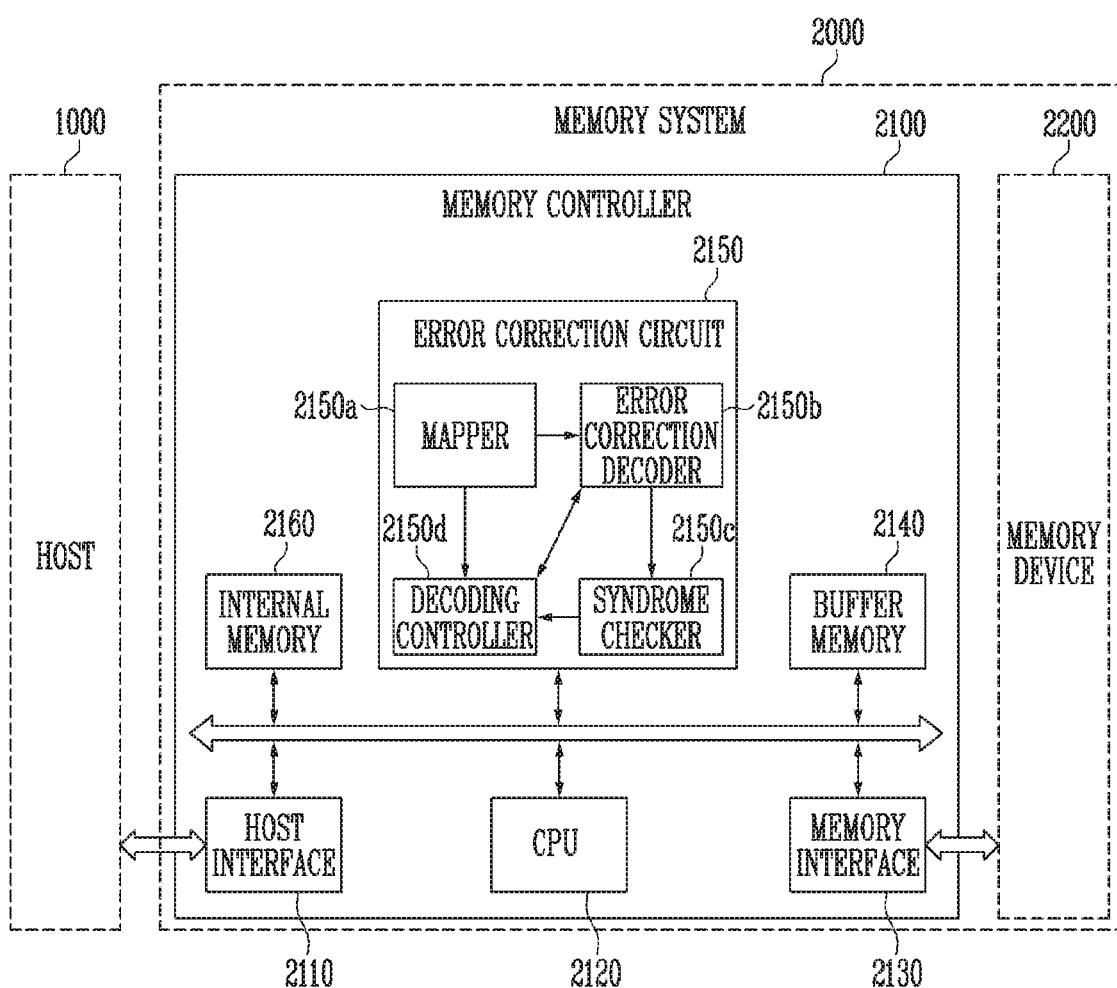
FIG. 12 is a diagram illustrating an example of a memory system based on an embodiment of the disclosed technology.

FIG. 12 is a diagram illustrating an example of a memory system based on an embodiment of the disclosed technology.

Referring to FIG. 12, the memory system 2000 may include a memory device 2200 for storing data and a memory controller 2100 for controlling the memory device 2200 under the control of a host 1000.

The host 1000 may communicate with the memory system 2000 by using an interface protocol such as Peripheral Component Interconnect-Express (PCI-E), Advanced Technology Attachment (ATA), Serial ATA (SATA), Parallel ATA (PATA), or Serial Attached SCSI (SAS). Interface protocols between the host 1000 and the memory system 2000 are not limited to the above-described examples, and interfaces such as a Universal Serial Bus (USB), a Multi-Media Card (MMC), an Enhanced Small Disk Interface (ESDI), and Integrated Drive Electronics (IDE) may be used. The host 1000 can be a device or a system that includes one or more computer processors which operate to retrieve digital information or data from the memory system 2000 or store or write digital information or data into the memory system 2000. In various applications, the host 1000 can be in various forms, including, for example, a personal computer (PC), a portable digital device, a tablet PC, a digital camera, a digital audio player, a digital multimedia player, a television, a wireless communication device, a cellular phone, console video game hardware, or a digital set-top box.

The memory controller 2100 may control overall operations of the memory system 2000, and control data exchange between the host 1000 and the memory device 2200.

The memory controller 2100 may include a host interface 2110, a central processing unit (CPU) 2120, a memory interface 2130, a buffer memory 2140, an error correction circuit 2150, and an internal memory 2160. The host interface 2110, the memory interface 2130, the buffer memory 2140, the error correction circuit 2150, and the internal memory 2160 may be controlled by the CPU 2120.

The host interface 2110 may exchange data with the host 1000, using a communication protocol.

The CPU 2120 may perform various calculations or generate a command and an address so as to control the memory device 2200. For example, the CPU 2120 may generate various commands necessary for a program operation, a read operation, an erase operation, a data compression operation, a copy-back operation, or others.

The memory interface 2130 may communicate with the memory device 2200, using a communication protocol.

The buffer memory 2140 may temporarily store data while the memory controller 2100 is controlling the memory device 2200. For example, data received from the host 1000 may be temporarily stored in the buffer memory 2140 until a program operation is completed. Also, data read from the memory device 2200 in a read operation may be temporarily stored in the buffer memory 2140.

The error correction circuit 2150 may perform encoding and decoding for error correction in a program operation or a read operation.

The error correction circuit 2150 may perform error correction decoding on read data (read values) received from the memory device 2200, When an error is detected in an iterative decoding process for error correction, the error correction circuit 2150 may correct the error, for example, using a parity check matrix. For example, the error correction circuit 2150 may calculate a syndrome corresponding to the read data, based on the parity check matrix, and determine whether an error is included in the read data, based on the calculated syndrome. When the error included in the read data is correctable, the error correction circuit 2150 may correct the error, and output the error-corrected data. When the error included in the read data is not correctable, the error correction circuit 2150 may report to the CPU 2120 that the decoding has failed.

The error correction circuit 2150 may include a mapper 2150a, an error correction decoder 2150b, a syndrome checker 2150c, and a decoding controller 2150d. The error correction circuit 2150 may have the same configuration as the error correction circuit 10 described with reference to FIG. 1, and may perform the same operation as the error correction circuit 10. That is, the mapper 2150a, the error correction decoder 2150b, the syndrome checker 2150c, and the decoding controller 2150d, which are shown in FIG. 12, may have configurations respectively corresponding to those of the mapper 110, the error correction decoder 120, the syndrome checker 130, and the decoding controller 140, which are shown in FIG. 1. The mapper 2150a, the error correction decoder 2150b, the syndrome checker 2150c, and the decoding controller 2150d, which are shown in FIG. 12, may perform operations respectively corresponding to those of the mapper 110, the error correction decoder 120, the syndrome checker 130, and the decoding controller 140, which are shown in FIG. 1. In some embodiments of the disclosed technology, at least one of the mapper 2150a, the syndrome checker 2150c, and the decoding controller 2150d may be implemented inside the error correction decoder 2150b. In some embodiments of the disclosed technology, the memory controller 2100 may further include one or more memories (not shown in FIG. 12) that can store tables such as lookup tables and tables of codes that the error correction circuit 2150 uses.

The internal memory 2160 may be used as a storage unit for storing various information required to operate the memory controller 2100. The internal memory 2160 may store a plurality of tables. For example, the internal memory 2160 may store a mapping table that is used to map logical addresses to physical addresses.

The memory device 2200 may perform operations such as a program operation, a read operation, an erase operation, a data compression operation, and a copy-back operation under the control of the memory controller 2100. The memory device 2200 may be configured as a volatile memory device in which stored data disappears when the supply of power is interrupted or turned off, or may be configured as a nonvolatile memory device in which stored data is retained even when the supply of power is interrupted or turned off.

Figure 13:
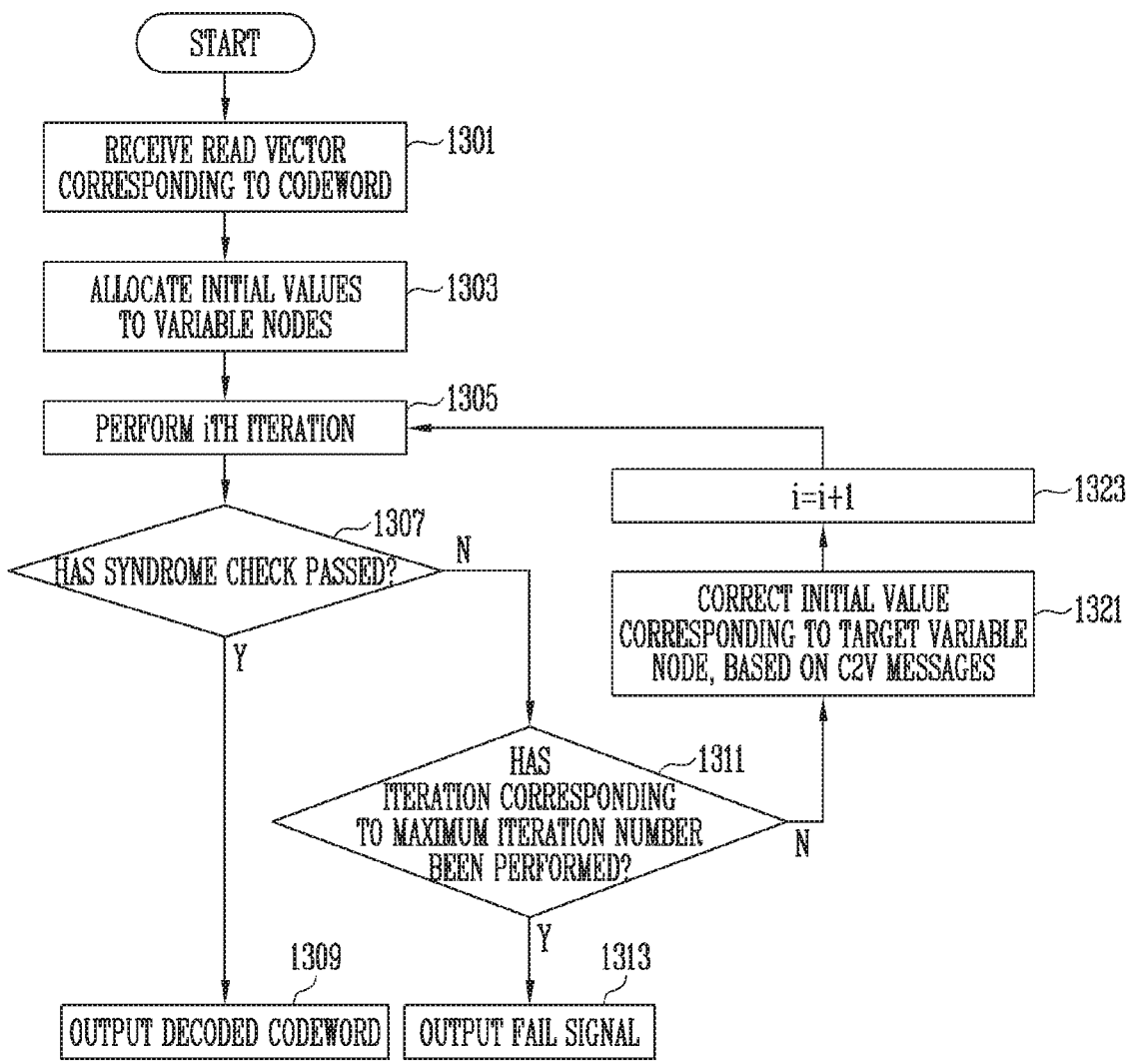
FIG. 13 is a flowchart illustrating an example of an operating method of the memory controller based on an embodiment of the disclosed technology.

FIG. 13 is a flowchart illustrating an example of an operating method of the memory controller based on an embodiment of the disclosed technology.

In step 1301, the memory controller may receive a read vector corresponding to a codeword. For example, the read vector may include read values respectively corresponding to a plurality of memory cells.

In step 1303, the memory controller may allocate initial values to variable nodes. When g read vectors corresponding to one codeword are received, the memory controller may generate a (g+1) level quantized read vector, which is quantized into g+1 levels, using the g read vectors. The memory controller may convert the (g+1) level quantized read vector to an initial vector. For example, the initial vector may include initial values respectively corresponding to a plurality of variable nodes. Each initial value may be an LLR value.

In step 1305, the memory controller may perform an ith iteration, using the iterative decoding technique. In the ith iteration, V2C messages and C2V messages are exchanged, and accordingly, variable nodes and check nodes may be updated.

In step 1307, the memory controller may perform a syndrome check corresponding to the ith iteration. For example, the memory controller may check whether a syndrome vector has passed the syndrome check in the ith iteration. When the syndrome check is successful, in step 1309, the memory controller may output a variable node vector in the ith iteration as a decoded codeword. When the syndrome check fails, step 1311 may be performed.

In the step 1311, the memory controller may check whether the iteration corresponding to a maximum iteration number has been performed. When the iteration corresponding to the maximum iteration number has already been performed, in step 1313, the memory controller may output a "fail" signal indicating that error correction decoding has failed. When the iteration corresponding to the maximum iteration number has not been performed yet, step 1321 may be performed.

In the step 1321, the memory controller may correct an initial value of a target variable node, based on C2V messages transferred to the target variable node in the ith iteration. This correction on the initial value of the target variable node may mean that the sign of the initial value of the target variable node is reversed as discussed above.

Subsequently, in the step 1305 performed after step 1323, the memory controller may perform an (i+1)th iteration.

Figure 14:
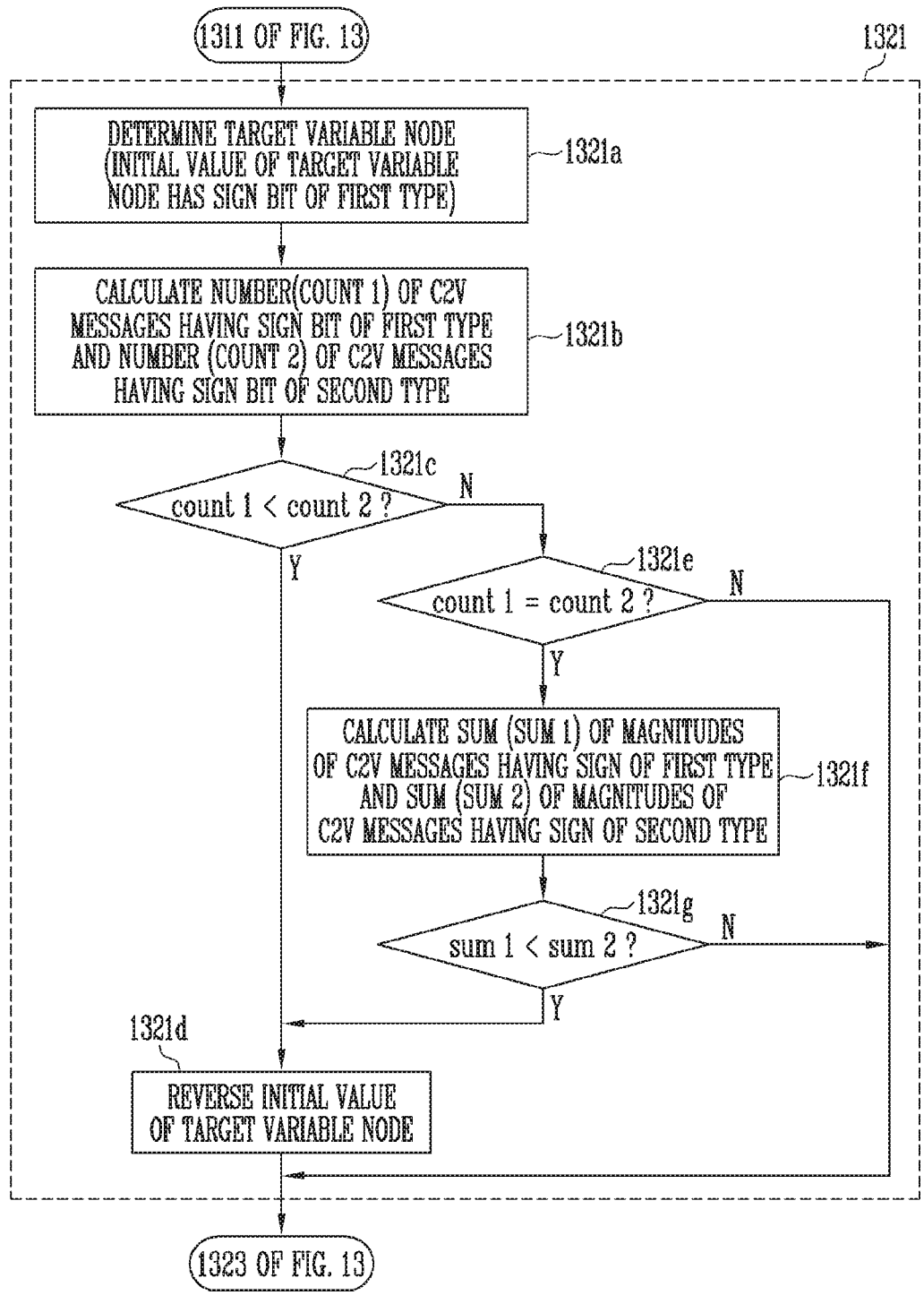
FIG. 14 is a flowchart illustrating an example of an operating method of the memory controller based on an embodiment of the disclosed technology.

FIG. 14 is a flowchart illustrating an example of an operating method of the memory controller based on an embodiment of the disclosed technology.

Steps shown in FIG. 14 may correspond to the step 1321 shown in FIG. 13.

In step 1321a, the memory controller may determine target variable nodes. In some embodiments of the disclosed technology, the memory controller may determine a variable node as a target variable node if an initial value of the variable node has a set magnitude. The set magnitude may be the largest value among initial values to be allocated to the variable nodes. In the embodiment described with reference to FIG. 14, it is assumed that the initial value of the target variable node has a sign of a first type. The sign of the first type may be a negative sign or a positive sign. In some embodiments of the disclosed technology, the step 1321a may be performed prior to the step 1305 of FIG. 13.

In step 1321b, the memory controller may calculate a number of C2V messages ("count 1" in FIG. 14) having the sign of the first type and a number of C2V messages ("count 2" in FIG. 14) having a sign of a second type, among C2V messages transmitted from the check nodes to the target variable node in the ith iteration.

In steps 1321c and 1321e, the memory controller may compare the number of count 1 with the number of count 2.

When the number of C2V messages having the sign of the first type (the number of count 1) is smaller than that the number of C2V messages having the sign of the second type (the number of count 2), in step 1321d, the memory controller may reverse the initial value of the target variable node. That is, the memory controller may reverse the sign of the initial value of the target variable node from the first type to the second type.

When the number of C2V messages having the sign of the first type (the number of count 1) is equal to the number of C2V messages having the sign of the second type (the number of count 2), in step 1321f, the memory controller may calculate a sum of magnitudes of the C2V messages having the sign of the first type (sum 1) and a sum of the C2V messages having the sign of the second type (sum 2).

In step 1321g, the memory controller may compare the sum 1 with the sum 2.

When the sum of magnitudes of the C2V messages having the sign of the first type (sum 1) is smaller than the sum of magnitudes of the C2V messages having the sign of the second type (sum 2), in the step 1321d, the memory controller may reverse the sign of the initial value of the target variable node.

Figure 15:
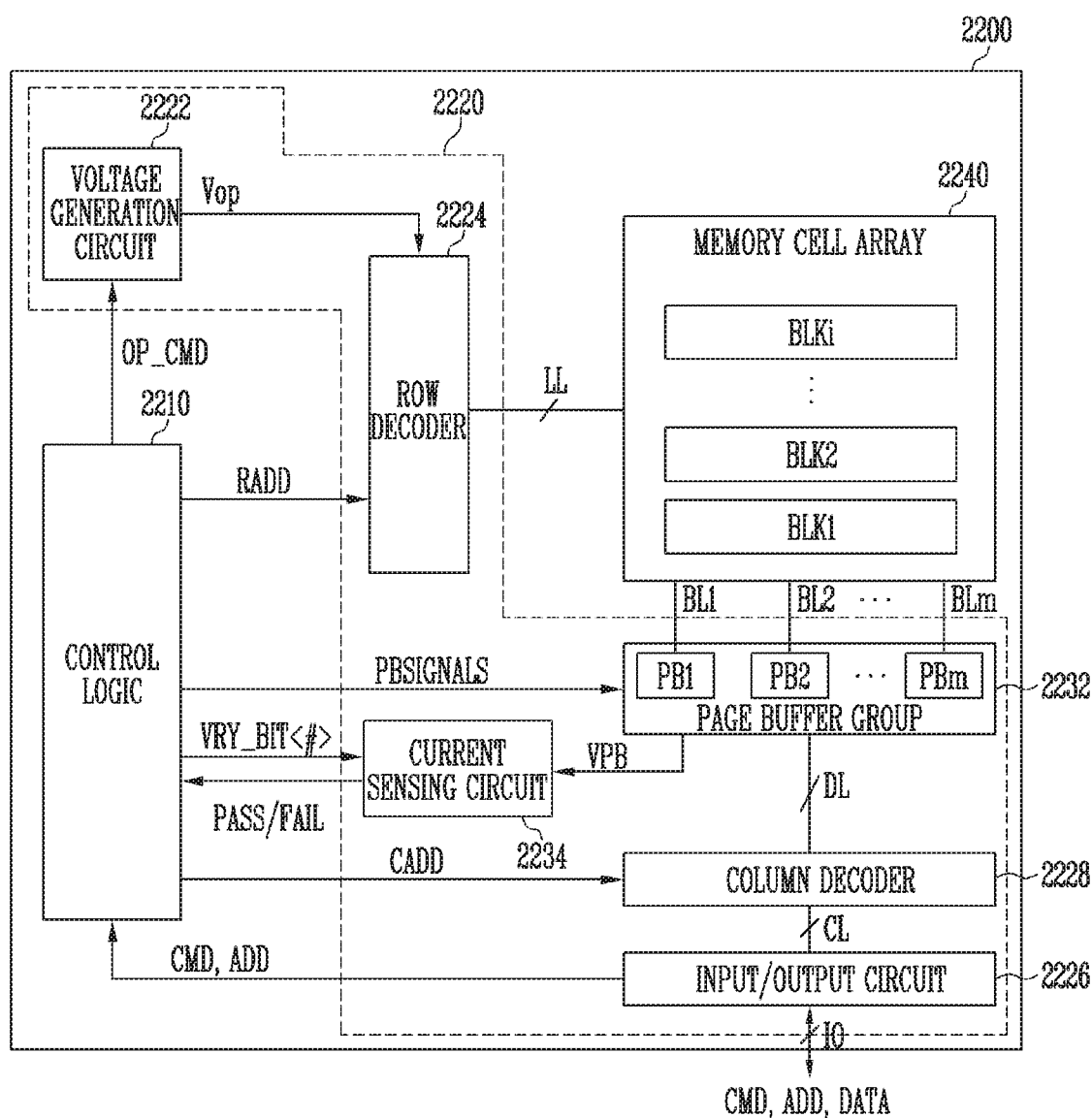
FIG. 15 is a diagram illustrating an example of a memory device based on an embodiment of the disclosed technology.

FIG. 15 is a diagram illustrating an example of a memory device based on an embodiment of the disclosed technology. The memory device shown in FIG. 15 may be applied to the memory system shown in FIG. 12.

The memory device 2200 may include a control logic 2210, a peripheral circuit 2220, and a memory cell array 2240. The peripheral circuit 2220 may include a voltage generation circuit 2222, a row decoder 2224, an input/output circuit 2226, a column decoder 2228, a page buffer group 2232, and a current sensing circuit 2234.

The control logic 2210 may control the peripheral circuit 2220 under the control of the memory controller 2100 shown in FIG. 12.

The control logic 2210 may control the peripheral circuit 2220 in response to a command CMD and an address ADD, which are received from the memory controller 2100 through the input/output circuit 2226. For example, the control logic 2210 may output an operation signal OP_CMD, a row address RADD, page buffer control signals PBSIGNALS, and an allow bit VRY_BIT<#> in response to the command CMD and the address ADD. The control logic 2210 may determine whether a "verify" operation is successful (whether a target memory cell has passed or failed a program verification) in response to a "pass" or "fail" signal PASS or FAIL received from the current sensing circuit 2234.

The peripheral circuit 2220 may perform a program operation for storing data in the memory cell array 2240, a read operation for reading out data stored in the memory cell array 2240, and an erase operation for erasing data stored in the memory cell array 2240.

The voltage generation circuit 2222 may generate various operating voltages Vop used in program, read, and erase operations in response to the operation signal OP_CMD received from the control logic 2210. For example, the voltage generation circuit 2222 may provide voltages such as a program voltage, a verify voltage, a pass voltage, a read voltage, an erase voltage, and a turn-on voltage to the row decoder 2224.

The row decoder 2224 may transfer the operating voltages Vop to local signal lines LL connected to a selected memory block among memory blocks of the memory cell array 2240 in response to the row address RADD received from the control logic 2210. The local signal lines LL may include local word lines, local drain select lines, and local source select lines. In addition, the local lines LL may include various lines such as a source line, which are connected to the memory block.

The input/output circuit 2226 may transfer the command CMD and the address ADD, which are received from the memory controller 2100, to the control logic 2210 through input/output lines IO, or exchange data with the column decoder 2228.

The column decoder 2228 may transfer data between the input/output circuit 2226 and the page buffer group 2232 in response to a column address CADD received from the control logic 2210, For example, the column decoder 2228 may exchange data with page buffers PB1 to PBm through data lines DL, or exchange data with the input/output circuit 2226 through column lines CL.

The page buffer group 2232 may be connected to bit lines BL1 to BLm connected in common to memory blocks BLK1 to BLKi. The page buffer group 2232 may include a plurality of page buffers PB1 to PBm connected to the bit lines BL1 to BLm. For example, one page buffer may be connected to each of the bit lines. The page buffers PB1 to PBm may operate in response to the page buffer control signals PB SIGNALS received from the control logic 2210. For example, in a program operation, the page buffers PB1 to PB4m may temporarily store program data received from the memory controller 2100, and may adjust a voltage applied to the bit lines BL1 to BLm according to the program data. Also, in a read operation, the page buffers PB1 to PBl may temporarily store data received through the bit lines BL1 to BLm, or may sense a voltage or current of the bit lines BL1 to BLm.

In a read or verify operation, the current sensing circuit 2234 may generate a reference current in response to the allow bit VRY_BIT<#> received from the control logic 2210, and may output a pass or fail signal PASS or FAIL by comparing a sensing voltage VPB received from the page buffer group 2232 with a reference voltage generated by the reference current.

The memory cell array 2240 may include a plurality of in memory blocks BLK1 to BLKi in which data is stored. User data and various information required to perform an operation of the memory device 2200 may be stored in the memory blocks BLK1 to BLKi. The memory blocks BLK1 to BLKi may be implemented in a two-dimensional structure or a three-dimensional structure, and may be configured identical to one another.

Figure 16:
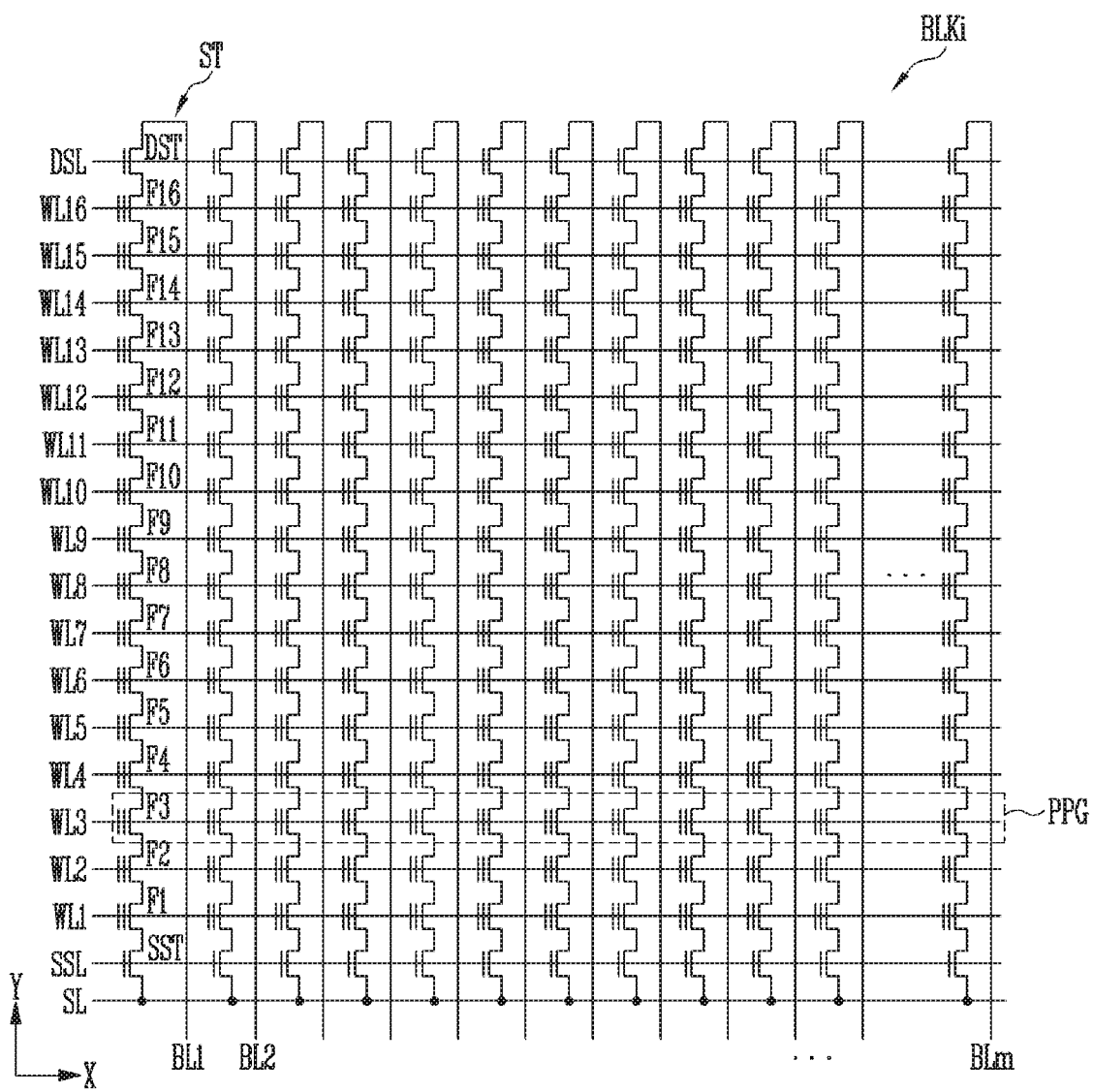
FIG. 16 is a diagram illustrating an example of a memory block.

FIG. 16 is a diagram illustrating an example of a memory block.

A memory cell array may include a plurality of memory blocks. For convenience of description, only one BLKi of the plurality of memory blocks is illustrated in FIG. 16.

Referring to FIG. 16, in the memory block BLKi, a plurality of word lines arranged in parallel to one another may be connected between a first select line and a second select line. The first select line may be a source select line SSL, and the second select line may be a drain select line DSL. Specifically, the memory block BLKi may include a plurality of strings (memory cell string) ST connected between bit lines BL1 to BLm and a source line SL. The bit lines BL1 to BLm may be connected to the strings ST, respectively, and the source line SL may be connected in common to the strings ST. The strings ST may be configured identically to one another, and therefore, a string ST connected to a first bit line BL1 will be described in detail as an example.

The string ST may include a source select transistor SST, a plurality of memory cells F1 to F16, and a drain select transistor DST, which are connected in series to each other between the source line SL and the first bit line BL1. At least one source select transistor SST and at least one drain select transistor DST may be included in one string ST. Although FIG. 16 illustrates each string ST includes only sixteen memory cells F1 to F16, the disclosed technology is not limited thereto, and thus each string may include more than sixteen memory cells.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of source select transistors SST included in different strings ST may be connected to the source select line SSL, gates of drain select transistors DST included in different strings ST may be connected to the drain select line DSL, gates of the memory cells F1 to F16 included in different strings ST may be connected to a plurality of word lines WL1 to WL16. A group of memory cells connected to the same word line among the memory cells included in different strings ST may be a physical page PPG. Therefore, in the memory block BLKi, the number of physical pages PPG may correspond to the number of the word lines WL1 to WL16.

In implementations, a memory cell may store data of one bit. Such a one-bit memory cell may be referred to as a single level cell (SLC). Under the SLC scenario, each physical page PPG may be mapped to only one logical page (LPG). Alternatively, one memory cell may store two or more bits of data. For example, a memory cell that can store two bits of data may be referred to as a multi-level cell (MLC). In this MLC type, two logical pages (LPG) may be mapped to one physical page PPG, and thus two bits of data are stored in each physical page PPG. In a triple-level cell (TLC) type, three logical pages (LPG) are mapped to one physical page PPG, and three bits of data may be stored in each physical page PPG. A memory cell can store more than three bits. For example, a quad-level cell can store four bits per cell.

Figure 17:
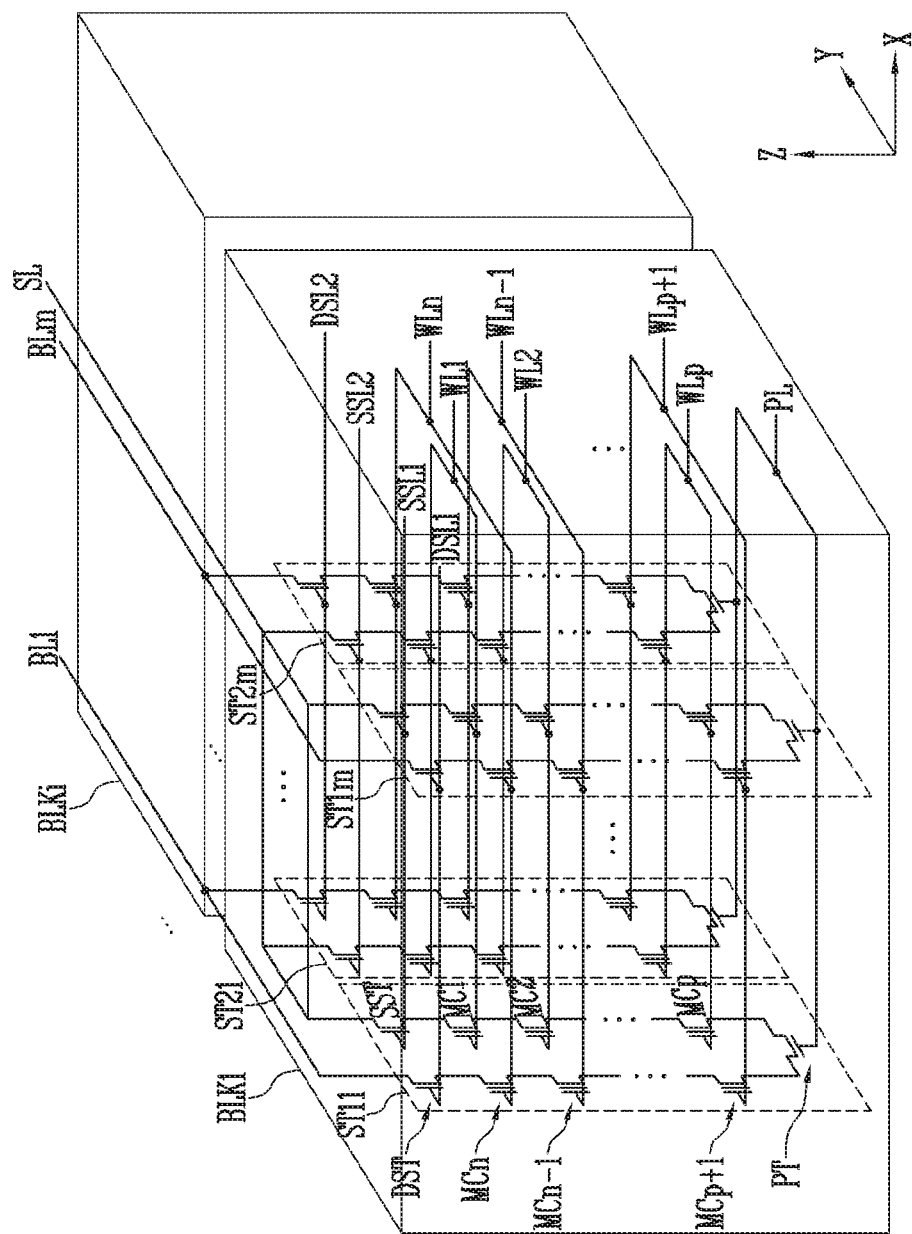
FIG. 17 is a diagram illustrating an example of a three-dimensionally configured memory block implemented based on some embodiments of the disclosed technology.

FIG. 17 is a diagram illustrating an example of a three-dimensionally configured memory block implemented based on some embodiments of the disclosed technology.

Referring to FIG. 17, the memory cell array 2240 may include a plurality of memory blocks BLK1 to BLKi. A first memory block BLK1 will be described as an example. The first memory block BLK1 may include a plurality of strings ST11 to ST1m and ST21 to ST2m. In an embodiment, each of the plurality of strings ST11 to ST1m and ST21 to ST2m may be formed in a ° U° shape. In the first memory block BLK1, m strings may be arranged in a row direction (X direction). FIG. 17 illustrates that two strings are arranged in a column direction (Y direction). In implementations, other arrangements are possible. For example, three or more strings may be arranged in the column direction (Y direction).

In the illustrated example in FIG. 17, each of the plurality of strings ST11 to ST1m and ST21 to ST2m may include at least one source select transistor SST, first to nth memory cells MC1 to MCn, a pipe transistor PT, and at least one drain select transistor DST.

The source and drain select transistors SST and DST and the memory cells MC1 to MCn may have structures similar to one another. For example, each of the source and drain select transistors SST and DST and the memory cells MC1 to MCn may include a channel layer, a tunnel insulating layer, a charge trapping layer, and a blocking insulating layer. For example, a pillar for providing the channel layer may be provided in each string. For example, a pillar for providing at least one of the channel layer, the tunnel insulating layer, the charge trapping layer, and the blocking insulating layer may be provided in each string.

The source select transistor SST of each string may be connected between a source line SL and memory cells MC1 to MCp.

In an embodiment of the disclosed technology, source select transistors of strings arranged in the same row may be connected to a source select line extending in the row direction, and source select transistors of strings arranged in different rows may be connected to different source select lines. In FIG. 17, source select transistors of strings ST11 to ST1m of a first row may be connected to a first source select line SSL1. Source select transistors of strings ST21 to ST2m of a second row may be connected to a second source select line SSL2.

In another embodiment of the disclosed technology, the source select transistors of the strings ST11 to ST1m and ST21 to ST2m may be connected in common to one source select line.

In the example in FIG. 17, first to nth memory cells MC1 to MCn of each string may be connected between the source select transistor SST and the drain select transistor DST. Here, the first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a vertical direction (Z direction), and be connected in series to each other between the source select transistor SST and the pipe transistor PT. The (p+1)th to nth memory cells MCp+1 to MCn may be sequentially arranged in the vertical direction (Z direction), and may be connected in series to each other between the pipe transistor PT and the drain select transistor DST. The first to pth memory cells MC1 to MCp and the (p+1)th to nth memory cells MCp+1 to MCn may be connected to each other through the pipe transistor PT. Gates of the first to nth memory cells MC1 to MCn of each string may be connected to first to nth word lines WL1 to WLn, respectively.

In some embodiments of the disclosed technology, at least one of the first to nth memory cells MC1 to MCn may be used as a dummy memory cell. When a dummy memory cell is provided, the voltage or current of a corresponding string can be stably controlled. A gate of the pipe transistor PT of each string may be connected to a pipe line PL.

The drain select transistor DST of each string may be connected to a bit line and the memory cells MCp+1 to MCn. Strings arranged in the row direction may be connected to a drain select line extending in the row direction. Drain select transistors of the strings ST11 to ST1m of the first row may be connected to a first drain select line DSL1. Drain select transistors of the strings ST21 to ST2m of the second row may be connected to a second drain select line DSL2.

Strings arranged in the column direction may be connected to bit lines extending in the column direction. In FIG. 17, strings ST11 and ST21 of a first column may be connected to a first bit line BL1. Strings ST1m and ST2m of an mth column may be connected to an mth bit line BLm.

Memory cells connected to the same word line among the strings arranged in the row direction may constitute one page. For example, memory cells connected to the first word line WL1 among the strings ST11 to ST1m of the first row may constitute one page. Memory cells connected to the first word line WL1 among the strings ST21 to ST2m of the second row may constitute another page. When any one of the drain select lines DSL1 and DSL2 is selected, strings arranged in one row direction may be selected. When any one of the word lines WL1 to WLn is selected, one page among the selected strings may be selected.

Figure 18:
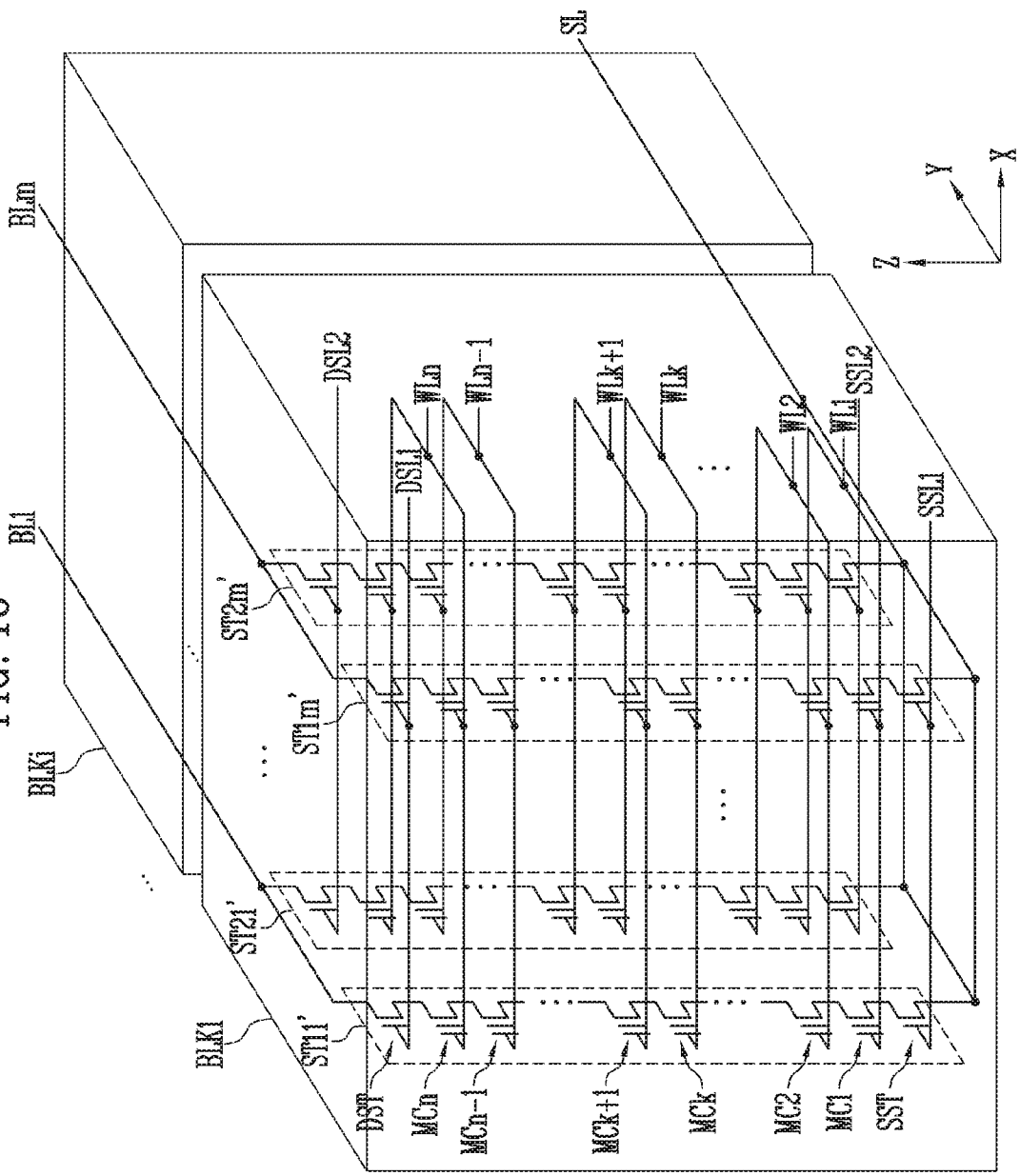
FIG. 18 is a diagram illustrating another example of the three-dimensionally configured memory block implemented based on some embodiments of the disclosed technology.

FIG. 18 is a diagram illustrating another example of the three-dimensionally configured memory block implemented based on some embodiments of the disclosed technology.

Referring to FIG. 18, the memory cell array 2240 may include a plurality of memory blocks BLK1 to BLKi. A first memory block BLK1 will be described as an example. The first memory block BLK1 may include a plurality of strings ST11' to ST1m' and ST21' to ST2m'. Each of the plurality of strings ST11' to ST1m' and ST21' to ST2m' may extend along a vertical direction (Z direction). In the first memory block BLK1, m' strings may be arranged in a row direction (X direction). Although FIG. 18 illustrates that two strings are arranged in a column direction (Y direction), this is for convenience of description, and three or more strings may be arranged in the column direction (Y direction).

Each of the plurality of strings ST11' to ST1m' and ST21' to ST2m' may include at least one source select transistor SST, first to nth memory cells MC1 to MCn, and at least one drain select transistor DST.

The source select transistor SST of each string may be connected between a source line SL and the memory cells MC1 to MCn. Source select transistors of strings arranged in the same row may be connected to the same source select line. Source select transistors of strings ST11' to ST1m' arranged on a first row may be connected to a first source select line SSL1. Source select transistors of strings ST21' to ST2m' arranged on a second row may be connected to a second source select line SSL2. In another embodiment, the source select transistors of the strings ST11' to ST1m' and ST21' to ST2m' may be commonly connected to one source select line.

The first to nth memory cells MC1 to MCn of each string may be connected in series to each other between the source select transistor SST and the drain select transistor DST. Gates of the first to nth memory cells MC1 to MCn may be connected to first to nth word lines WL1 to WLn, respectively.

In an embodiment, at least one of the first to nth memory cells MC1 to MCn may be used as a dummy memory cell that does not store data and provide circuitry operation to facilitate or improve the operation or performance of a memory cell that stores data. In the illustrated example where a dummy memory cell is provided, the voltage or current of a corresponding string can be stably controlled. Accordingly, the reliability of data stored in the first memory block BLK1 can be improved.

The drain select transistor DST of each string may be connected between a bit line and the memory cells MC1 to MCn. Drain select transistors DST of strings arranged in the row direction may be connected to a drain select line extending in the row direction. The drain select transistors DST of the strings ST11' to ST1m' of the first row may be connected to a first drain select line DSL1. The drain select transistors DST of the strings ST21' to ST2m' of the second row may be connected to a second drain select line DSL2.

That is, the first memory block BLK1 of FIG. 18 may have a circuit identical to that of the first memory block BLK1 of FIG. 17, except that the pipe transistor PT is excluded from each string.

Figure 19:
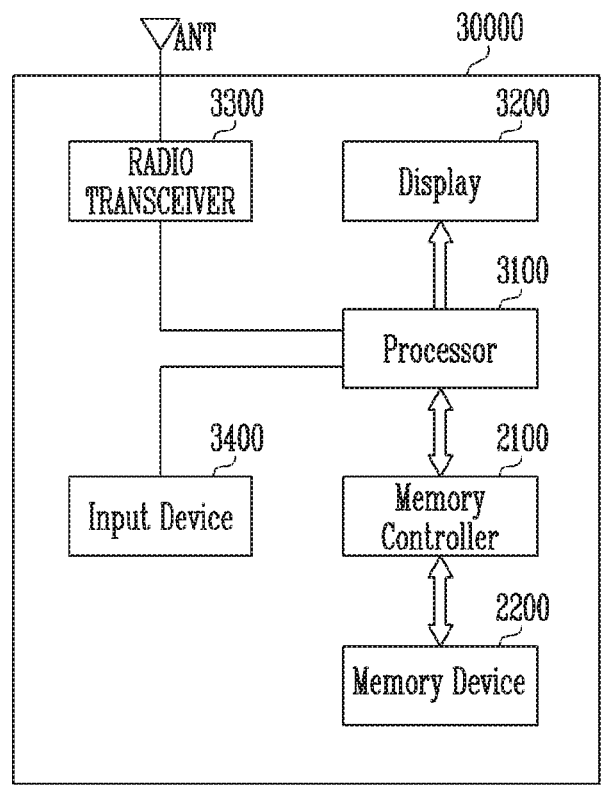
FIGS. 19 to 22 are diagrams illustrating other examples of the memory system including the memory controller shown in FIG. 12.

FIG. 19 is a diagram illustrating another example of the memory system including the memory controller shown in FIG. 12.

Referring to FIG. 19, the memory system 30000 may be implemented as a cellular phone, a smart phone, a tablet PC, a personal digital assistant (PDA), or a wireless communication device. The memory system 30000 may include a memory device 2200 and a memory controller 2100 capable of controlling an operation of the memory device 2200.

The memory controller 2100 may control a data access operation of the memory device 2200, e.g., a program operation, an erase operation, a read operation, or the like under the control of a processor 3100.

Data programmed in the memory device 2200 may be output through a display 3200 under the control of the memory controller 2100.

A radio transceiver 3300 may transmit/receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 2100 or the display 3200. The memory controller 2100 may transmit the signal processed by the processor 3100 to the memory device 2200. Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 2100, data output from the radio transceiver 3300, or data output from the input device 3400 can be output through the display 3200.

In some embodiments, the memory controller 2100 capable of controlling an operation of the memory device 2200 may be implemented as a part of the processor 3100, or be implemented as a chip separate from the processor 3100.

Figure 20:
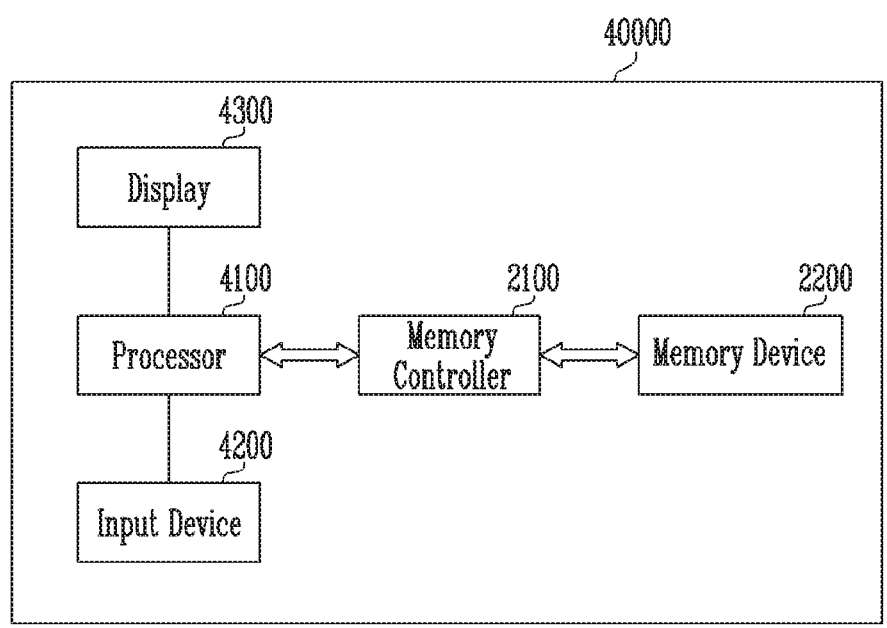

FIG. 20 is a diagram illustrating another example of the memory system including the memory controller shown in FIG. 12.

Referring to FIG. 20, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a memory device 2200 and a memory controller 2100 capable of controlling a data processing operation of the memory device 2200.

A processor 4100 may output data stored in the memory device 2200 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 2100. In some embodiments, the memory controller 2100 capable of controlling an operation of the memory device 2200 may be implemented as a part of the processor 4100, or be implemented as a chip separate from the processor 4100.

Figure 21:
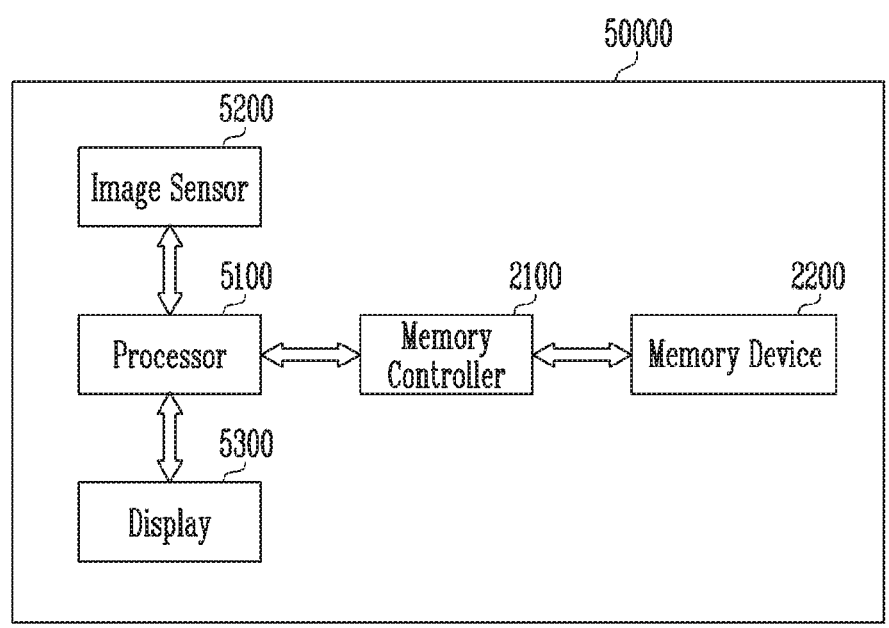

FIG. 21 is a diagram illustrating another example of the memory system including the memory controller shown in FIG. 12.

Referring to FIG. 21, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 2200 and a memory controller 2100 capable of controlling a data processing operation of the memory device 2200, e.g., a program operation, an erase operation, or a read operation.

An image sensor 5200 of the memory system 50000 may convert an optical image into digital signals, and the converted digital signals may be transmitted to a processor 5100 or the memory controller 2100. Under the control of the processor 5100, the converted digital signals may be output through a display 5300, or be stored in the memory device 2200 through the memory controller 2100. In addition, data stored in the memory device 2200 may be output through the display 5300 under the control of the processor 5100 or the memory controller 2100.

In some embodiments, the memory controller 2100 capable of controlling an operation of the memory device 2200 may be implemented as a part of the processor 5100, or be implemented as a chip separate from the processor 5100.

Figure 22:
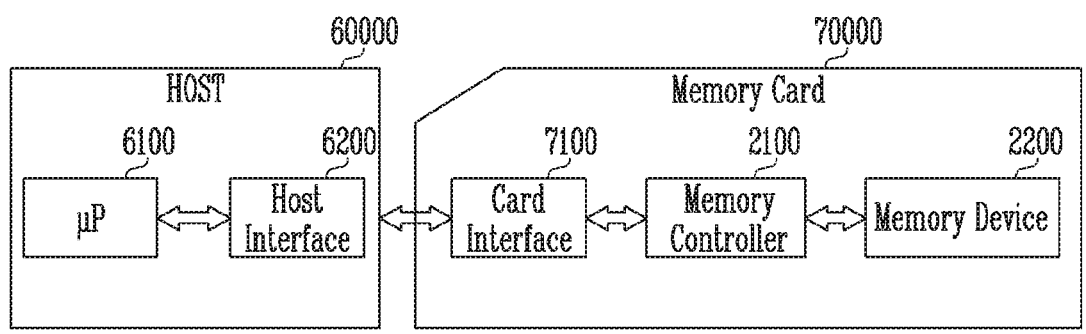

FIG. 22 is a diagram illustrating another example of the memory system including the memory controller shown in FIG. 12.

Referring to FIG. 22, the memory system 70000 may be implemented as a memory card or a smart card. The memory system 70000 may include a memory device 2200, a memory controller 2100, and a card interface 7100.

The memory controller 2100 may control data exchange between the memory device 2200 and the card interface 7100. In some embodiments, the card interface 7100 may be a Secure Digital (SD) card interface or a Multi-Media Card (MMC) interface, but the present disclosure is not limited thereto.

The card interface 7100 may interface data exchange between a host 60000 and the memory controller 2100 according to a protocol of the host 60000. In some embodiments, the card interface 7100 may support a Universal Serial Bus (USB) protocol and an Inter-Chip (IC)-USB protocol. The card interface 7100 may mean hardware capable of supporting a protocol used by the host 60000, software embedded in the hardware, or a signal transmission scheme.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 2200 through the card interface 7100 and the memory controller 2100 under the control of a microprocessor (μP) 6100.

In some embodiments of the disclosed technology, a memory apparatus that stores more than one bit of data per memory cell includes a processor and a memory comprising processor executable code. The processor executable code, upon execution by the processor causes the processor to configure a low-density parity check (LDPC) decoder to operate using a message-passing iterative decoding. The LDPC decoder includes a plurality of variable nodes and a plurality of check nodes. The LDPC decoder is configured to generate and pass messages between the variable nodes and the check nodes and to update the variable nodes and check nodes to enable multiple iterations of decoding operations to generate a decoded bit from a target variable node. The processor executable code, upon execution by the processor causes the LDPC decoder to assign an initial value to the target variable node, upon receipt of the messages sent to the target variable node from neighboring check nodes, determine whether a target memory cell corresponding to the target variable node has a hard error, upon a determination that the target memory cell has the hard error, reverse a sign of the initial value of the target variable node, and use the sign-reversed initial value together with the messages sent to the target variable node from neighboring check nodes to produce new messages that are sent to the neighboring check nodes.

The determination that the target memory cell corresponding to the target variable node has the hard error includes determining that more than half of the messages passed from the check nodes have the opposite sign of the initial value of the target variable node. The determination that the target memory cell corresponding to the target variable node has the hard error includes determining that a sum of magnitudes of messages with the opposite sign of the initial value of the target variable node is larger than a sum of magnitudes of messages with the same sign as the initial value of the target variable node, where half of the messages passed from the check nodes have the same sign as the initial value of the target variable node and the other half of the messages passed from the check nodes have the opposite sign of the initial value of the target variable node.

By implementing the technology disclosed in the present disclosure, the performance of error correction decoding may be improved even when a hard error occurs by preventing the wrong initial value of the target variable node from affecting the error correction performance for other variable nodes. The data error correction performance is one of the key factors that determine the system performance, and thus such a hard error can also affect the performance of electronic systems such as computer systems and mobile systems configured to storage devices such as NAND flash memory and flash memory based solid disk drives (SSD). By implementing the technology disclosed in the present disclosure, therefore, the performance of electronic systems may be improved by improving the data error correction performance.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Only a few implementations and examples are described and other implementations, enhancements and variations can be made based on what is described and illustrated in this patent document.

What is claimed is:

1. A memory controller for performing error correction decoding, using an iterative decoding scheme, the memory controller comprising:
   a mapper configured to convert read values received from a channel to initial log likelihood ratio (LLR) values;
   a variable node update module configured to allocate the initial LLR values to a plurality of variable nodes and update values of the variable nodes using the initial LLR values and check to variable (C2V) messages corresponding to the variable nodes in an ith iteration, wherein i is a natural number that is less than a predetermined number of maximum iterations;
   a check node update module configured to generate C2V messages to be transferred to the variable nodes using variable to check (V2C) messages corresponding to check nodes in the ith iteration;
   a syndrome checker configured to perform a syndrome check using the values of the variable nodes updated in the ith iteration; and
   a reversal determiner configured to, upon a determination by the syndrome checker that the syndrome check corresponding to the ith iteration has failed, determine whether to reverse a sign of an initial LLR value of a target variable node based on a ratio of signs of the C2V messages corresponding to the target variable node,
   wherein at least one of the mapper, the variable node update module, the check node update module, the syndrome checker and the reversal determiner is implemented using one or more hardware processors, wherein the reversal determiner is configured to:
compare a number of C2V messages having a sign of a first type, which corresponds to the sign of the initial LLR value of the target variable node, with a number of C2V messages having a sign of a second type which is different from the sign of the first type, among the C2V messages corresponding to the target variable node; and
determine whether to reverse the sign of the initial LLR value of the target variable node based on a result of comparison between the number of C2V messages having the sign of the first type among the C2V messages corresponding to the target variable node and the number of C2V messages having the sign of the second type among the C2V messages corresponding to the target variable node.

2. The memory controller of claim 1, comprising a message number calculator configured to calculate the number of C2V messages having the sign of the first type and the number of C2V messages having the sign of the second type, among the C2V messages corresponding to the target variable node.

3. The memory controller of claim 2, wherein the reversal determiner is configured to provide an indication to reverse the sign of the initial LLR value of the target variable node upon a determination that the number of C2V messages having the sign of the first type among the C2V messages corresponding to the target variable node is smaller than the number of C2V messages having the sign of the second type among the C2V messages corresponding to the target variable node.

4. The memory controller of claim 2, further comprising a sum calculator configured to calculate a sum of magnitudes of the C2V messages having the sign of the first type and a sum of magnitudes of the C2V messages having the sign of the second type, among the C2V messages corresponding to the target variable node,
wherein, upon a determination that the number of C2V messages having the sign of the first type among the C2V messages corresponding to the target variable node is equal to the number of C2V messages having the sign of the second type among the C2V messages corresponding to the target variable node, the reversal determiner is configured to provide an indication to reverse the sign of the initial LLR value of the target variable node based on the sum of magnitudes of the C2V messages having the sign of the first type among the C2V messages corresponding to the target variable node and the sum of magnitudes of the C2V messages having the sign of the second type among the C2V messages corresponding to the target variable node.

5. The memory controller of claim 4, wherein the reversal determiner is configured to provide an indication to reverse the sign of the initial LLR value of the target variable node upon a determination that the sum of magnitudes of the C2V messages having the sign of the first type among the C2V messages corresponding to the target variable node is smaller than the sum of magnitudes of the C2V messages having the sign of the second type among the C2V messages corresponding to the target variable node.

6. The memory controller of claim 1, comprising a sign reverser coupled to the reversal determiner and configured to reverse the sign of the initial LLR value of the target variable node to produce a sign-reversed initial LLR value upon receiving an indication from the reversal determiner that the sign of the initial LLR value of the target variable node is to be reversed.

7. The memory controller of claim 6, wherein the variable node update module is configured to generate the V2C messages to be transferred to check nodes connected to the target variable node, using the sign-reversed initial LLR value.

8. The memory controller of claim 1, further comprising a target variable node determiner configured to determine, as the target variable node, a variable node corresponding to an initial LLR value having a set magnitude among the plurality of variable nodes.

9. A method of performing, by a memory controller, error correction decoding, using an iterative decoding scheme, the method comprising:
converting read values, received from a channel, to initial log likelihood ratio (LLR) values;
allocating the initial LLR values respectively to a plurality of variable nodes;
generating check to variable (C2V) messages to be transferred to the variable nodes, the C2V message generated using variable to check (V2C) messages corresponding to check nodes in an ith iteration;
updating values of the variable nodes, using the initial LLR values and the C2V messages corresponding to the variable nodes in the ith iteration, wherein i is a natural number that is less than a predetermined number of maximum iterations;
performing a syndrome check using the values of the variable nodes updated in the ith iteration; and
determining whether to reverse a sign of an initial LLR value of a target variable node based on a ratio of signs of the C2V messages corresponding to the target variable node, when the syndrome check corresponding to the ith iteration fails,
wherein determining whether to reverse the sign of the initial LLR value of the target variable node includes:
compare a number of C2V messages having a sign of a first type, which corresponds to the sign of the initial LLR value of the target variable node, with a number of C2V messages having a sign of a second type which is different from the sign of the first type, among the C2V messages corresponding to the target variable node; and
determining whether to reverse the sign of the initial LLR value of the target variable node based on a result of comparison between the number of C2V messages having the sign of the first type among the C2V messages corresponding to the target variable node and the number of C2V messages having the sign of the second type among the C2V messages corresponding to the target variable node.

10. The method of claim 9, wherein determining whether to reverse the sign of the initial LLR value of the target variable node includes determining to reverse the sign of the initial LLR value of the target variable node when the number of C2V messages having the sign of the first type among the C2V messages corresponding to the target variable node is smaller than the number of C2V messages having the sign of the second type among the C2V messages corresponding to the target variable node.

11. The method of claim 10, wherein determining whether to reverse the sign of the initial LLR value of the target variable node includes determining whether to reverse the sign of the initial LLR value of the target variable node based on a sum of magnitudes of the C2V messages having the sign of the first type among the C2V messages corresponding to the target variable node and a sum of magnitudes of the C2V messages having the sign of the second type among the C2V messages corresponding to the target variable node, when the number of C2V messages having the sign of the first type among the C2V messages corresponding to the target variable node is equal to the number of C2V messages having the sign of the second type among the C2V messages corresponding to the target variable node.

12. The method of claim 11, wherein determining whether to reverse the sign of the initial LLR value of the target variable node includes determining to reverse the sign of the initial LLR value of the target variable node, when the sum of magnitudes of the C2V messages having the sign of the first type among the C2V messages corresponding to the target variable node is smaller than the sum of magnitudes of the C2V messages having the sign of the second type among the C2V messages corresponding to the target variable node.

13. The method of claim 9, further comprising reversing the sign of the initial LLR value of the target variable node to produce a sign-reversed initial LLR value, when it is determined that the sign of the initial LLR value of the target variable node is to be reversed.

14. The method of claim 13, further comprising generating V2C messages to be transferred to check nodes connected to the target variable node, using the sign-reversed initial LLR value.

15. The method of claim 9, further comprising determining, as the target variable node, a variable node corresponding to an initial LLR value having a set magnitude among the plurality of variable nodes.

16. A memory apparatus that stores more than one bit of data per memory cell, comprising:
  a processor and a memory comprising processor executable code, wherein the processor executable code, upon execution by the processor, causes the processor to configure a low-density parity check (LDPC) decoder to operate using a message-passing iterative decoding, the LDPC decoder including a plurality of variable nodes and a plurality of check nodes, the LDPC decoder configured to generate and pass messages between the variable nodes and the check nodes and to update the variable nodes and the check nodes to enable multiple iterations of decoding operations to generate a decoded bit from a target variable node, wherein the processor executable code, upon execution by the processor, causes the LDPC decoder to:
  assign an initial value to the target variable node;
  upon receipt of the messages sent to the target variable node from neighboring check nodes, determine whether a target memory cell corresponding to the target variable node has a hard error;
  upon a determination that the target memory cell has the hard error, reverse a sign of the initial value of the target variable node; and
  use the sign-reversed initial value together with the messages sent to the target variable node from neighboring check nodes to produce new messages that are sent to the neighboring check nodes,
  wherein the determining whether the target memory cell corresponding to the target variable node has the hard error includes:
  comparing a number of messages having a same sign as the initial value of the target variable node with a number of messages having an opposite sign of the initial value of the target variable node, among the messages sent to the target variable node from neighboring check nodes; and
  determining whether the target memory cell corresponding to the target variable node has the hard error based on a result of comparison between the number of messages having the same sign as the initial value of the target variable node among the messages sent to the target variable node from neighboring check nodes and the number of messages having the opposite sign of the initial value of the target variable node among the messages sent to the target variable node from neighboring check nodes.

17. The memory apparatus of claim 16, wherein the determination that the target memory cell corresponding to the target variable node has the hard error includes determining that more than half of the messages passed from the check nodes have the opposite sign of the initial value of the target variable node.

18. The memory apparatus of claim 16, wherein the determination that the target memory cell corresponding to the target variable node has the hard error includes determining that a sum of magnitudes of messages having the opposite sign of the initial value of the target variable node among the messages sent to the target variable node from neighboring check nodes is larger than a sum of magnitudes of messages having the same sign as the initial value of the target variable node among the messages sent to the target variable node from neighboring check nodes, where half of the messages passed from the check nodes have the same sign as the initial value of the target variable node and the other half of the messages passed from the check nodes have the opposite sign of the initial value of the target variable node.

* * * * *